US010329688B2

(12) United States Patent
Doolittle

(10) Patent No.: US 10,329,688 B2
(45) Date of Patent: *Jun. 25, 2019

(54) EFFUSION CELLS, DEPOSITION SYSTEMS INCLUDING EFFUSION CELLS, AND RELATED METHODS

(71) Applicant: Innovative Advanced Materials, Inc., Hampton, GA (US)

(72) Inventor: William Alan Doolittle, Hampton, GA (US)

(73) Assignee: Innovative Advanced Materials, Inc., Hampton, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/495,458

(22) Filed: Apr. 24, 2017

(65) Prior Publication Data
US 2017/0306523 A1 Oct. 26, 2017

Related U.S. Application Data

(60) Provisional application No. 62/327,323, filed on Apr. 25, 2016, provisional application No. 62/349,499, filed on Jun. 13, 2016.

(51) Int. Cl.
*C23C 16/00* (2006.01)
*C30B 23/06* (2006.01)
(Continued)

(52) U.S. Cl.
CPC .......... *C30B 23/066* (2013.01); *C23C 14/243* (2013.01); *C23C 14/246* (2013.01);
(Continued)

(58) Field of Classification Search
CPC ............................. C23C 14/243; C23C 14/246
(Continued)

(56) References Cited

U.S. PATENT DOCUMENTS 3,329,524 A * 7/1967 Smith, Jr. ............... C22B 9/228
117/108
3,620,956 A 11/1971 Gauger
(Continued)

FOREIGN PATENT DOCUMENTS

CN 1519391 A 11/2004
CN 102534507 A 7/2012
(Continued)

OTHER PUBLICATIONS

Carver, Alexander Gilman, Novel Chlorine-Based Chemistry and Implementation Hardware for the Growth of Lithium Niobate and Related Complex Metal Oxides, A Dissertation Presented to The Academic Faculty at Georgi Institute of Technology, May 2009, 170 pages.

(Continued)

*Primary Examiner* — Keath T Chen
(74) *Attorney, Agent, or Firm* — TraskBritt

(57) ABSTRACT

An effusion cell includes a crucible for containing material to be evaporated or sublimated, a delivery tube configured to deliver evaporated or sublimated material originating from the crucible into a chamber, a supply tube extending from the crucible, the supply tube located and configured to trap condensate originating from the evaporated or sublimated material and to deliver the condensate back to the crucible, and at least one heating element located and configured to heat material in the crucible so as to cause evaporation or sublimation of the material and flow of the evaporated or sublimated material through the delivery tube and out from the effusion cell. The effusion cell is configured such that the crucible can be filled with the material to be evaporated or sublimated without removing the effusion cell from the process vacuum chamber. Semiconductor substrate processing systems may include such effusion cells.

20 Claims, 13 Drawing Sheets

(51) Int. Cl.
*C23C 14/24* (2006.01)
*C23C 14/28* (2006.01)
*C30B 23/00* (2006.01)
*H01J 37/32* (2006.01)
*C23C 14/26* (2006.01)

(52) U.S. Cl.
CPC .............. *C23C 14/26* (2013.01); *C23C 14/28* (2013.01); *C30B 23/005* (2013.01); *H01J 37/3244* (2013.01); *H01J 37/32082* (2013.01); *H01J 37/32889* (2013.01); *H01J 2237/332* (2013.01)

(58) Field of Classification Search
USPC .................................................. 118/726, 727
See application file for complete search history.

(56) References Cited

U.S. PATENT DOCUMENTS

| | | | |
|---|---|---|---|
| 3,652,330 A * | 3/1972 | Anderson | C23C 14/24 430/128 |
| 3,690,638 A * | 9/1972 | Roblin | C23C 14/24 118/718 |
| 3,974,002 A | 8/1976 | Casey, Jr. et al. | |
| 4,518,846 A | 5/1985 | Freeouf et al. | |
| 4,646,680 A | 3/1987 | Maki | |
| 4,690,098 A | 9/1987 | Mertens et al. | |
| 4,707,333 A * | 11/1987 | Gardiner | C23C 14/246 266/200 |
| 4,748,315 A * | 5/1988 | Takahashi | C23C 14/243 118/726 |
| 4,812,326 A | 3/1989 | Tsukazaki et al. | |
| 4,813,373 A | 3/1989 | Demay et al. | |
| 5,041,719 A | 8/1991 | Harris et al. | |
| 5,104,695 A * | 4/1992 | Greer | C23C 14/243 118/720 |
| 5,288,327 A | 2/1994 | Bhat | |
| 5,431,735 A | 7/1995 | Briones | |
| 5,733,609 A | 3/1998 | Wang | |
| 5,932,294 A | 8/1999 | Colombo et al. | |
| 6,011,904 A * | 1/2000 | Mattord | C30B 23/066 118/726 |
| 6,030,458 A * | 2/2000 | Colombo | C23C 14/243 118/719 |
| 6,162,300 A | 12/2000 | Bichrt | |
| 6,202,591 B1 * | 3/2001 | Witzman | C23C 14/243 118/723 VE |
| 6,342,103 B1 * | 1/2002 | Ramsay | C23C 14/243 118/723 EB |
| 6,467,427 B1 | 10/2002 | Peng | |
| 6,551,405 B1 | 4/2003 | Thibado et al. | |
| 6,695,954 B2 | 2/2004 | Hong | |
| 7,194,197 B1 | 3/2007 | Wendt et al. | |
| 7,638,168 B2 | 12/2009 | Boroson et al. | |
| 7,760,992 B2 | 7/2010 | Wendt et al. | |
| 8,190,006 B2 | 5/2012 | Wendt et al. | |
| 8,858,714 B2 | 10/2014 | Guyaux et al. | |
| 9,142,413 B2 | 9/2015 | Moseley et al. | |
| 2002/0182885 A1 | 12/2002 | Hwu et al. | |
| 2002/0192499 A1 | 12/2002 | Tokailin et al. | |
| 2004/0255857 A1 * | 12/2004 | Chow | C23C 14/243 118/715 |
| 2006/0153986 A1 | 7/2006 | Yamamoto | |
| 2007/0089676 A1 * | 4/2007 | Klemm | C23C 14/042 118/726 |
| 2008/0047487 A1 | 2/2008 | Doolittle et al. | |
| 2010/0031878 A1 | 2/2010 | Priddy et al. | |
| 2010/0122656 A1 | 5/2010 | Long et al. | |
| 2010/0122659 A1 * | 5/2010 | Long | C23C 14/12 118/726 |
| 2010/0248416 A1 | 9/2010 | Priddy et al. | |
| 2010/0285218 A1 | 11/2010 | Conroy et al. | |
| 2011/0114665 A1 * | 5/2011 | Chandler | C23C 16/047 118/726 |
| 2011/0165326 A1 | 7/2011 | Little et al. | |
| 2011/0209995 A1 | 9/2011 | Rasheed et al. | |
| 2012/0094014 A1 * | 4/2012 | Ono | C23C 14/12 427/66 |
| 2016/0312356 A1 * | 10/2016 | Jung | C23C 14/26 |

FOREIGN PATENT DOCUMENTS

| | | |
|---|---|---|
| EP | 2524974 A1 | 11/2012 |
| WO | 2008037958 A1 | 4/2008 |
| WO | 2012064748 A1 | 5/2012 |

OTHER PUBLICATIONS

International Search Report for International Application No. PCT/US2017/029163 dated Jul. 21, 2017, 2 pages.
International Written Opinion for International Application No. PCT/US2017/029163 dated Jul. 21, 2017, 4 pages.
Phosphorus Valved Cracker 500cc Mark V User Guide, Veeco, 43 pages, Nov. 2009.

* cited by examiner

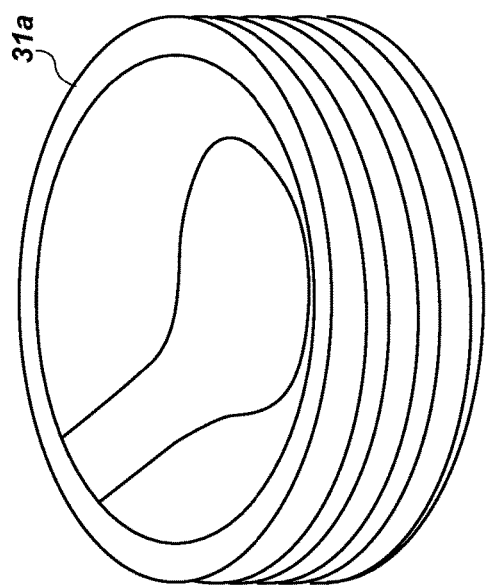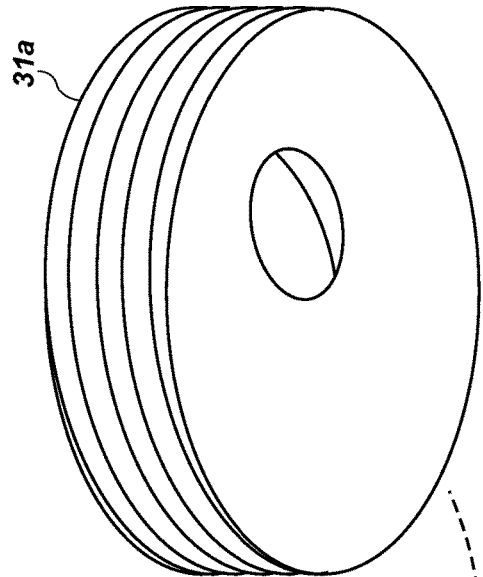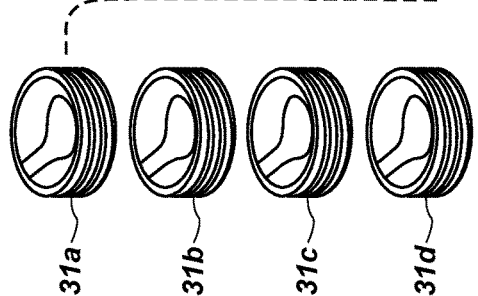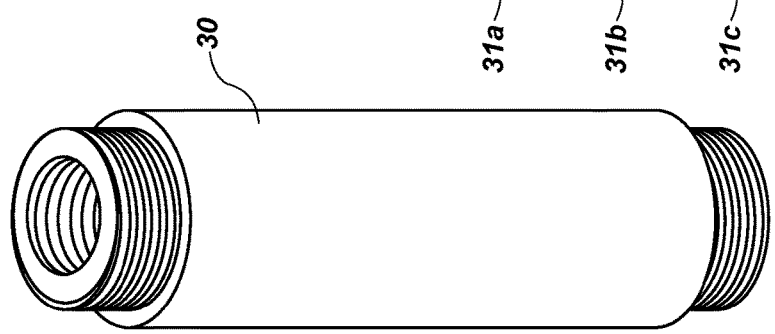
FIG. 5B
FIG. 5C
FIG. 5A

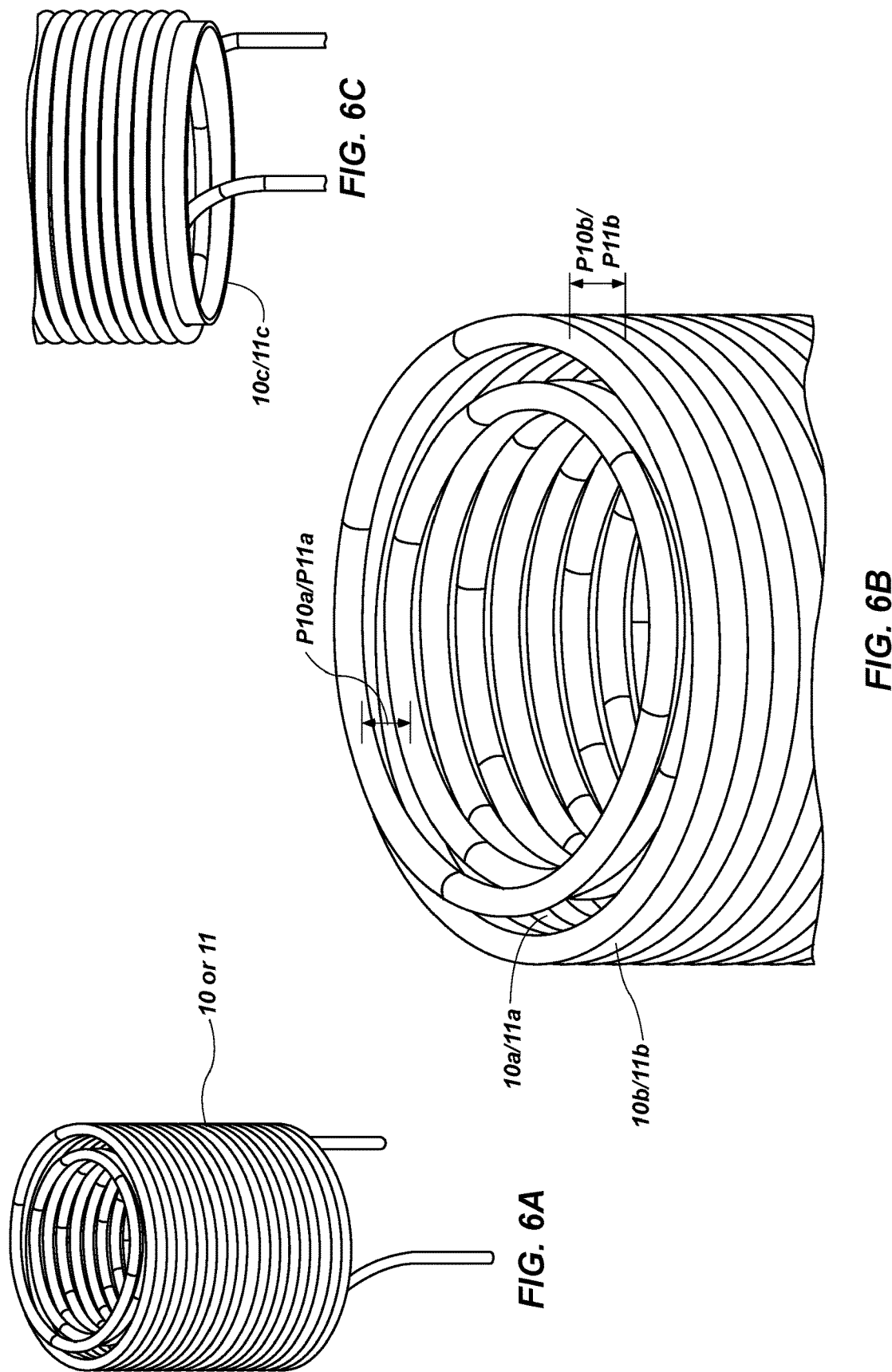

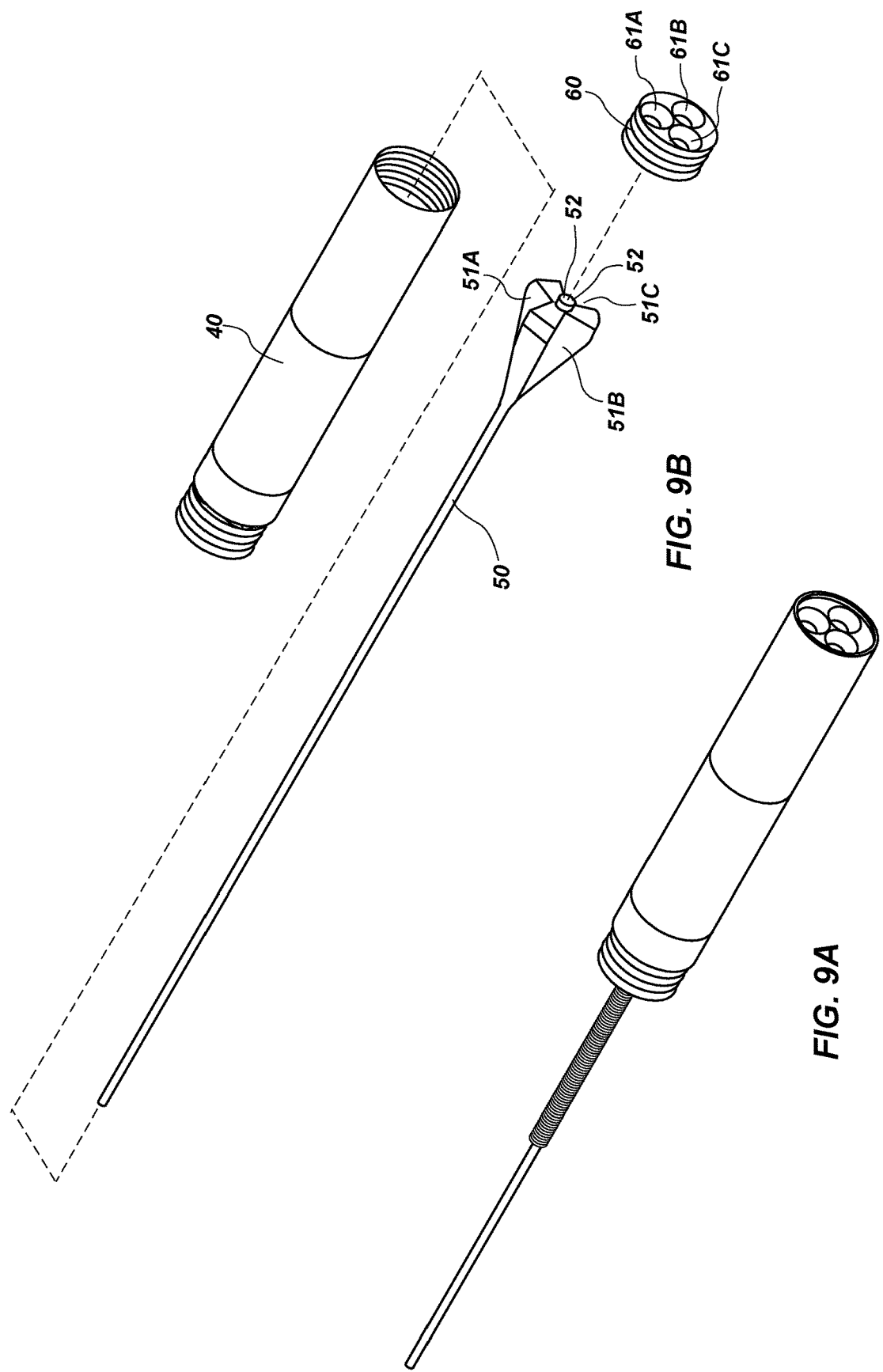

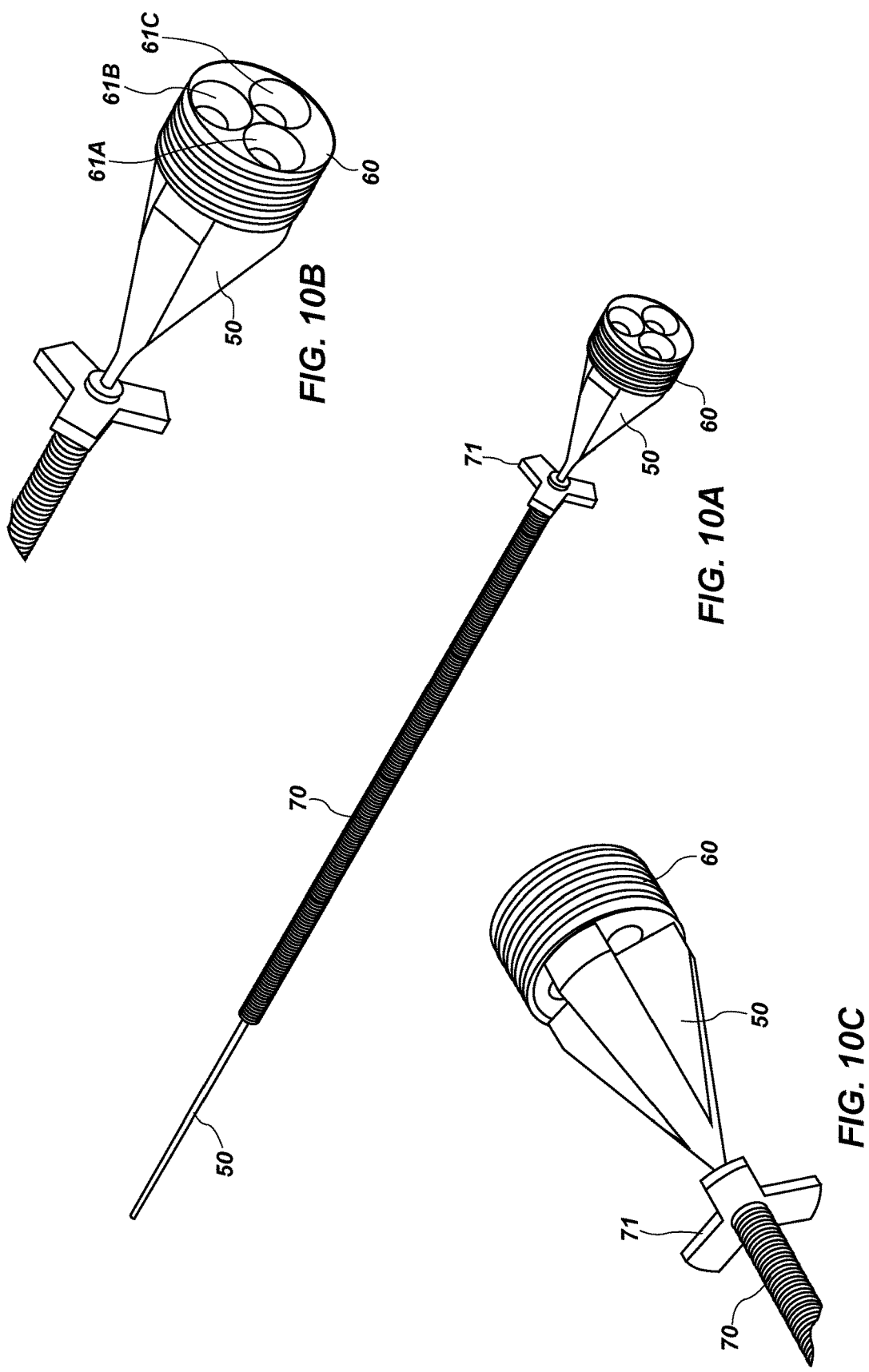

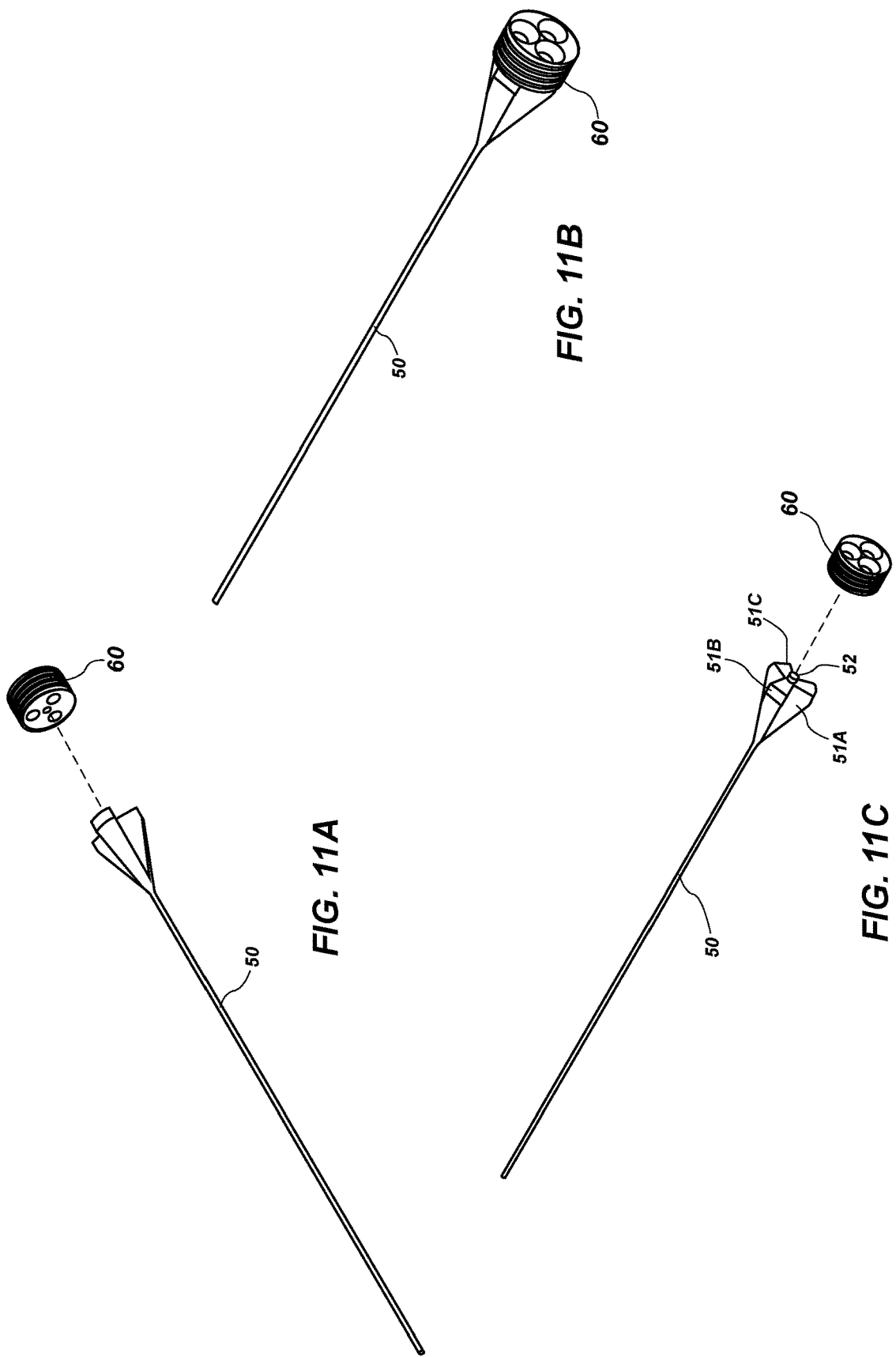

EFFUSION CELLS, DEPOSITION SYSTEMS INCLUDING EFFUSION CELLS, AND RELATED METHODS

CROSS-REFERENCE TO RELATED APPLICATION

This application claims the benefit of U.S. Provisional Patent Application Ser. No. 62/327,323, which was filed Apr. 25, 2016, and also claims the benefit of U.S. Provisional Application Ser. No. 62/349,499, which was filed Jun. 13, 2016, the disclosures of which are hereby incorporated herein in their entireties by this reference. The subject matter of this application is also related to the subject matter of U.S. application Ser. No. 15/495,488, filed Apr. 24, 2017, and titled "Deposition Systems Including Effusion Sources, and Related Methods", the disclosure of which is also hereby incorporated herein in its entirety by this reference.

TECHNICAL FIELD

The present disclosure relates to effusion sources for use with physical vapor deposition systems, to deposition systems including such effusion cells, and to methods of making and using such effusion cells and deposition systems.

BACKGROUND

Physical vapor deposition is a well-known deposition process in which elements or molecules to be deposited on a substrate within a deposition chamber are supplied via evaporation or sublimation processes. While physically different processes, the words "evaporation" and "sublimation" are used interchangeably herein and depend only on the material to be deposited. The deposition chamber is enclosed and typically under vacuum. In other words, at least some measurable amount of gas is removed from within the deposition chamber. The deposition chamber is typically formed from steel, aluminum, other metal or glass and defines a physical boundary between an outside region, typically air, and the internal region wherein the gas is partially removed.

When gas is at a temperature above absolute zero Kelvin, each molecule or atom of gas has a specific kinetic energy defined by $\frac{1}{2} mv^2$, where m is the mass of the gas particle (an atom or molecule) and v is the particle's velocity. When these energetic particles collide with the chamber walls, they exert a force on the chamber walls. This force exerted on the chamber walls is manifest as a pressure and is often described in units such as pounds per square inch (psi), pascals or torr among other units commonly known by those skilled in the art. The amount of force exerted depends on the area of the chamber, the number of collisions that occur, and, thus, the density and kinetic energy of the gas.

When one considers a system wherein the pressure outside of the chamber is different than that inside the vacuum chamber, a net force acts on the chamber walls. If the pressure outside the chamber is less than that inside the chamber, a force is exerted that tries to expand or even rupture the chamber. In this case, the chamber is referred to as a pressure chamber. If the pressure inside the chamber is less than the pressure outside of the chamber, a net force is exerted that tends to try and compress or even crush the chamber. In this case, the chamber is often referred to as a vacuum chamber and must be robustly built so as to withstand the forces exerted on it. From this point forward, for shorthand, the "chamber" will be referred to as a "vacuum chamber" or "chamber."

In many applications, such as semiconductor, optical coatings, tool coatings, and various biomedical applications, the processing of products include, but are not limited to, thin film deposition, etching and annealing. It is, thus, desirable to not only evacuate a chamber, but to also introduce to the vacuum chamber a controlled flow of a known gas. This gas may supply a product used in the deposition, etching, annealing or, in general, used for processing the product produced in a vacuum environment. The vacuum may provide a means of processing not possible without the vacuum, such as plasma processing, or might merely provide a pressure differential so as to allow a gas to flow and thus be delivered to the product under process. Alternatively, the vacuum may provide a means of reducing undesirable background impurity concentrations so as to prevent contamination of the product or prevent undesirable chemical or thermal reactions. Those skilled in the art are aware of a multiplicity of reasons for using a vacuum to process a product, with these mentioned here are only given as examples and not intended to be exhaustive.

Since it is not typically possible to remove all of the gas particles in a chamber, some measurable amount of residual gas exists defining a vacuum chamber pressure as measured typically relative to atmospheric pressure at sea level (1 atmosphere equals 760 torr). When gas is removed such that the pressure is ~<760 torr to ~$1 \times 10^{-3}$ torr, the vacuum is said to be "medium vacuum." When the pressure is further reduced to a range of ~$1 \times 10^{-3}$ torr to ~$1 \times 10^{-8}$ torr, the vacuum is said to be "high vacuum" or "HV." When the pressure is further lowered to below ~$1 \times 10^{-8}$ torr, the vacuum is said to be "ultra-high vacuum" or "UHV."

The geometric size of the chamber, regardless of whether that chamber is a vacuum chamber, tube, orifice or any other enclosed volume, defines the certain key features of how the gas flows through a system. Thus, all enclosed volumes are simply referred to as a "chamber." When gases are at sufficiently low pressure, the particles do not frequently collide with one another. The average distance for which the particles travel before they collide with each other is commonly known by those skilled in the art as the "mean free path" (between collisions). When the chamber walls are separated by distances less than the mean free path ($\lambda$), the collisions with the chamber walls dominate over inter-particle collisions in determining the resistance to gas flow via momentum transfer to and from the gas and chamber walls. This mode of gas flow is referred to as "molecular flow."

When the mean free path of the gas is less than the dimensions of the chamber walls, the inter-particle collisions dominate the resistance to gas flow via momentum transfers from particle to particle. This mode of gas flow is known as "viscous flow" and behaves much like a fluid wherein the particles act to slow down and scatter other particles with lesser impedance effect from the chamber walls.

A gas can convert from one mode of flow to another as it travels through the vacuum system. For example, the gas can be delivered in a small tube (one form of a vacuum chamber) wherein its pressure and the tube dimensions define it to be in the viscous flow mode. The gas can subsequently be injected into a larger chamber, wherein its pressure and chamber dimensions define the gas to be in the molecular flow mode. A dimensionless quantity defined by the ratio of the mean free path to chamber major dimension known to those skilled in the art as the "Knudson number" ("K"), defines which mode the gas is in. If the Knudson number is greater than approximately 1, the gas tends toward molecular flow behavior, whereas if the Knudson number is less than approximately 1, the gas tends toward viscous flow. Those skilled in the art recognize that no clear boundary exists to define viscous vs. molecular flow and, thus, a region defined as "mixed flow" is often used to define the transition in flow characteristics when the Knudson number is approximately 1.

Often, the processing speed of a vacuum tool is determined in part by the "gas throughput" ("Q"), which is related to the molecular flux J. Throughput is a measure of the total mass flow through a system. Thus, higher mass flow equates to more gaseous species entering the chamber. In a deposition system, higher Q or J is desirable so as to increase the deposition rates and thus process throughput. Throughput Q is given in common units of torr-liters per second, standard (atmospheric pressure) cubic centimeters per second, standard liters per second or other units known to those skilled in the art. Molecular flux J is given in units of either number of atoms/(cm²-second) or grams/(cm²-second). In some cases, this throughput is defined at a given pressure at which the chamber is intended to operate, while in other cases, it is defined relative to atmospheric pressure (standard pressure).

The chamber pressure and the gas throughput are related by the chamber conductance C. The chamber, tube or orifice conductance is a measure of the inverse resistance to the flow of a gas and most often is measured in units of liters per second (L/S). Consequently, when in the molecular flow regime, the conductance is defined solely by the dimensions of the chamber, which act to restrict the flow with inter-particle collisions, having little effect on restricting the gas flow. Likewise, the conductance of the chamber in the viscous flow regime is dependent on the pressure of the gas, given that the gas pressure determines the number of collisions and, thus, the impedance to gas flow. In general, the relationship between Q, C and pressure P, is $$Q=CP, \quad \text{Equation 1)}$$

where C is a constant dependent on chamber dimensions for molecular flow and C is a variable dependent on both chamber dimensions and on pressure for viscous flow. A more accurate equation for viscous flow considers the pressure dependence of the conductance resulting in $$Q=F(P^2_{up}-P^2_{down}), \quad \text{Equation 2)}$$

where $P_{up}$ is the pressure in the upstream flow (source of the gas flow) and $P_{down}$ is the pressure in the downstream of the gas flow (in the vacuum chamber or in the pump supplying vacuum to the chamber). The difference between the upstream and downstream pressures is often great enough that the downstream pressure can be ignored. Thus, Equation 2) can be reduced to Equation 1) by making $C=F/(2\times P_{average})\sim F/(2\times P_{up})$.

A vacuum requires some sort of pump to remove the gas from the vacuum chamber to create the vacuum. The flow of gases into the chamber would result in a pressure increase unless a vacuum pump continuously removed the gas. Thus, every vacuum system contains at least one, often more than one, vacuum pump. The performance of a vacuum pump is described by a quantity known as the pumping speed S, and having units identical to that of the chamber conductance. Thus, the pumping speed of a pump is dependent on pressure in the viscous flow regime and independent of pressure in the molecular flow regime.

Since the pumping speed and the chamber conductance have the same unit, one can describe the combined effect of each by replacing the conductance C in Equations 1 and 2 by an effective conductance $C_{eff}$, $$1/C_{eff}=1/C+1/S. \quad \text{Equation 3)}$$

Likewise when several (n) chambers, large and small, as well as a pump are connected in a series gas flow arrangement, the effective conductance is found by $$1/C_{eff}=1/C_1+1/C_2+\ldots 1/C_n+1/S. \quad \text{Equation 4)}$$

When a pump having a high pumping speed is connected to a series of chambers of various dimensions, the lowest conductance chamber, i.e., the one with the smallest characteristic dimensions, will determine the overall conductance and, thus, dictate the throughput and pressure of the system. Thus, if a high-speed pump is connected through a small opening (limited conductance) to a vacuum chamber, the opening limits the overall conductance and, thus, the throughput and achievable pressure. This feature will prove important in understanding embodiments of the present disclosure, and will lead to ability to ignore the pumping speed S in Equations 3 and 4, resulting in the system flux throughput being determined by the pressure of the sources and the combined conductances of the delivery system (i.e., the effusion cell as described herein).

Under molecular flow conditions, the conductance is independent of pressure since the gas molecules are less likely to interact with one another. A circular orifice (an aperture with an opening that has a thickness substantially smaller than the diameter of the opening) has a conductance of:

$$C=11.6\pi D^2/4; \text{ or}$$

$$C=11.6(\text{Cross-sectional Area}_{orifice}). \quad \text{Equation 5)}$$

The conductance of a tube is:

$$C_{tube}=11.6(D^3/L); \text{ or}$$

$$C_{tube}=11.6(\text{Cross Sectional Area}_{tube})(4D/\pi L), \quad \text{Equation 6)}$$

where D is the orifice/tube inner diameter in cm, L is the tube length in cm, and P is pressure in torr. Note, for this molecular flow case, conductance C is independent of pressure.

For viscous flow for a tube, conductance C is given by:

$$C=180(D^4/L)P_{average}; \text{ or}$$

$$C=180(\text{Cross sectional Area}_{tube})(4D^2/\pi L)P_{average}. \quad \text{Equation 7)}$$

A more accurate means of characterizing gas flow in the viscous flow regime than simply $Q=C_{eff}P$ is $$Q=F(P^2_{upstream}-P^2_{downstream}) \quad \text{Equation 8)}$$

where $P_{upstream}$ is the pressure upstream of the orifice and $P_{downstream}$ is the pressure downstream of the orifice, F is related to conductance, C by the relationship:

$$F=C/(2P_{average}), \text{ where}$$

$$P_{average}=0.5(P_{upstream}+P_{downstream}). \quad \text{Equation 9)}$$

The relationship between C and F for the viscous flow tube can be proven as follows:

$$Q = C(P_{upstream} - P_{downstream})$$

$$P_{average}Q = C(P_{upstream} - P_{downstream})P_{average}$$

-continued $$P_{average}Q = C(P_{upstream} - P_{downstream})\frac{(P_{upstream} + P_{downstream})}{2}$$

$$P_{average}Q = C(P_{upstream}^2 - P_{upstream}P_{downstream} + P_{upstream}P_{downstream} - P_{downstream}^2)\frac{1}{2}$$

$$Q = \left(\frac{C}{2P_{average}}\right)(P_{upstream}^2 - P_{downstream}^2)$$

$$Q = F(P_{upstream}^2 - P_{downstream}^2)$$

$$\therefore F = \left(\frac{C}{2P_{average}}\right)$$

In Equations 5 through 7, all conductances are measured in L/Sec when dimensions are expressed in cm, pressure in Torr, and where the pre-factors to each of the above conductance equations account for the unit transformations. Non-circular apertures and tubes have similar expressions well known in the art but are less common.

The area dimensions of the openings of the tube and the orifice affect the conductance. Thus, for high mass flow as described by Equation 1), it is desirable to have large diameter tubes and orifices, maximizing the conductance.

Since embodiments of the present disclosure utilize several robust mechanical connections designed to support substantially larger mechanical loads than prior crucible and effusion cell designs, and since these connections might be required (in some cases) to be liquid tight so as to not allow liquefied evaporate material to escape, a means of joining thick and heavy parts in vacuum without creating a "virtual leak" may be required. A virtual leak is a pocket of trapped gas (not liquid) in a volume connected to the vacuum via a low conductance pathway. Such a pathway is often a small or highly constricted opening or a long narrow pathway such as a thread. Methods well known in the art to avoid virtual leaks include center boring bolts and screws to be used in blind tapped holes so as to provide an alternative gas pathway or slotting the female threads of a joint, allowing a more direct (straighter and shorter) path for gases to escape. Unfortunately, while slotting a female thread is necessary for allowing the trapped gas to escape, it also allows an opportunity for the liquid evaporate material to "wick" through the slot and escape the joint.

As is well known in the art, an MBE (molecular beam epitaxy) system consists of one or more heated crucibles filled with evaporate (or sublimation) materials configured in a vacuum chamber so as to direct the evaporate material toward a substrate to be condensed as a solid film. Mechanical shutters are typically placed outside of the crucibles so as to interrupt or allow the flux of evaporate material to deposit on the substrate. Crucibles are typically designed to be thin-walled materials (typically ~0.035 inch thick) often made of Pyrolytic Boron Nitride (PBN) or other suitable high purity, heat transparent material or, in some cases, heat opaque refractory metals, oxides such as alumina, beryllium oxide, or graphite. In general, the crucibles can be removed and replaced, making them interchangeable and, thus, not material specific. Since it is desirable to adjust the evaporate flux to achieve various rates of deposition or to mix evaporate materials in specific flux ratios to produce composite thin films, in almost all cases, the MBE crucibles are thin so as to minimize the thermal mass and, thus, to maximize the response time of changing temperatures and, thus, changing the desired evaporate flux.

In any thin film deposition system, but particularly in MBE, the upper deposition rate is limited by the onset of "spitting" from the effusion cell. Spitting can result from convection flows (sometimes inaccurately referred to as "boiling") established in a heated melt, which increase in ferocity as temperature is raised, resulting in liberation of droplets of liquid that can reach the substrate and result in defects ranging from metal droplets to dried chemically reacted droplet alloys that in some applications are often described as "oval defects" for their identifying geometry. Source spitting can also occur at lower temperatures when some evaporate condenses on the crucible wall and collects. This collection is aggravated when using heat transparent materials such as PBN because the walls of the crucible above the melt are not as hot as the melt itself, encouraging condensation of droplets on the walls. These condensed droplets can fall back into the melt "splattering" liquid out of the cell. Either of these mechanisms, or other similar mechanisms known in the art, can result in source spitting that can incorporate defects in the deposited film. At a moderate rate of deposition, spitting defect production has been reduced by heating the orifice, or lip as in "hot lip" designs of the crucible to prevent material condensation or using reentrant crucible shapes. These designs suffer from inefficient heat absorption, and limited temperature differential compared to the melt region providing only modest reduction of spitting compared to standard open cell designs.

A "campaign length" is the time an MBE or PVD system can be used for growth before the system has to be opened for maintenance, most often material reloading. Almost all currently used effusion cells utilize a single opening design, wherein the material is evaporated through the same opening through which the material is loaded. This requires that the effusion cell be removed from the system to reload expended material. In processes requiring high purity, such as deposition of semiconductor material where one impurity in approximately 100 trillion semiconductor atoms is considered "impure," this breaking of vacuum and subsequent system contamination via $H_2O$, CO, $O_2$, $CO_2$ and other contaminating gases found in the atmosphere, causes an expensive and time consuming "post-maintenance cleanup" cycle to be employed. Often, the entire system is baked at elevated temperatures as high as 250° C. for several days to drive out the impurities into various pumps. This is deemed as one of the primary industrial limitations of the MBE process and is the primary reason many manufacturers select competitive technologies instead of MBE. In the select few sources that do not load materials through the same opening through which they evaporate the material, the design is such that breaking vacuum to load the materials is still required, resulting in similarly limited campaign length.

Uniformity of the deposited film on the target substrate is the statistical and geometric variation of the thickness of the film or atomic composition of an alloy, if so composed, as a function of position on the substrate. PVD systems, such as MBE systems, are known for producing highly uniform films with standard deviations of thickness and composition being 1% or less in some cases. Given that the flux distribution versus angle to the effusion cell axis typically follows a cosine to a power (that power typically being less than ~3), high uniformity in an MBE system is obtained by increasing the source-to-substrate distance to a large enough distance so as to obtain a nearly flat flux distribution as shown in FIGS. 1A and 1B. However, since the flux arriving at the substrate reduces by a factor of $1/L_{SS}^2$, where $L_{SS}$ is the substrate-to-source spacing, this common practice also reduces the deposition rates substantially. Positive draft crucibles have been used to improve uniformity, but these have reduced capacity compared to straight wall crucibles and exhibit well-known long-term flux instabilities known as "depletion effects," wherein the surface area of the materials being evaporated change as the material is depleted, changing the flux over time, even at a constant temperature. All open-ended crucibles, whether positive draft (conical) or straight walled, exhibit some measure of long-term flux instabilities due to depletion effects and are prone to short-term flux instabilities when the external shutter is opened or closed. These short-term external shutter flux transients are well known to result from the transient cooling or heating of the effusion cell when the partially heat-reflecting shutter is removed from the effusion cell opening, thus, allowing more (open shutter) or less (closed shutter) heat loss from the cell that is compensated for by transient variations driven by the Proportional Integral Derivative (PID) control system, which applies more (open shutter) or less (closed shutter) power to the resistive filaments to return to the desired constant temperature.

It is known that the flow leaving an effusion cell containing a vapor or gas with pressure P and proceeding into a vacuum via a restricted, sufficiently thin opening (an orifice) of cross-sectional area A is given by:

$$J=PA/(2\pi mkT)^{1/2}, \quad \text{Equation 10}$$

where the opening is sufficiently thin to be classified as an orifice by having a thickness much thinner than the opening width and with: J=flow, m=molecular mass in kG of the evaporated species, k=Boltzmann constant, T=absolute temperature in the cell, P=pressure in the cell linked with the temperature T related by a law in the form:

$$P=Ye^{(-Ea/kT)}, \quad \text{Equation 11}$$

Y being a characteristic constant of the evaporated material and Ea is an activation energy associated with the evaporation or sublimation process.

The exact flux of molecules at a distance from the orifice, $L_{SS}$, into the vacuum is a complex function of many variables, but is known in the art. Some of these variables include J, orifice size, A, orifice shape, and even local pressure (P is a function of position z, where $0 \leq z \leq L_{SS}$), which changes as the molecular beam expands or focuses as it processes into the vacuum to substrate location point $L_{SS}$.

Lambert's approximation is thus useful and says an incident flux F on a substrate located at a distance $L_{SS}$ from the orifice diminishes as the square of the distance, $L_{SS}$, from the orifice:

$$F=HJ/(L_{SS}^2), \quad \text{Equation 12}$$

where H is a proportionality factor.

Known methods of creating this flux typically involve a crucible containing the material to be vaporized, a filament heater to apply heat to the crucible, and a beam-blocking mechanism (shutter or valve). Crucibles can be made from a variety of materials but are selected for their ability to not react chemically with the source material to be vaporized, and minimal outgassing of undesirable contaminant gases. The crucible is most often a container with one open end, but in some cases, is a sealed container with a nozzle or orifice designed to constrict or shape the flux leaving the cell.

The vast majority of effusion cells use a mechanical shutter mounted exterior to the crucible consisting of a blade placed in the path of the molecular beam of the flux leaving the effusion cell. These exterior mounted shutters reduce the delivered flux, but at higher pressures where scattering or chamber desorption occurs, this flux reduction may only be a factor of ~10 when in the closed position. This blade can be made of W, Ta, Mo, PBN, graphite or any other material of sufficiently limited reactivity with the evaporate material and is typically not heated, resulting in a continually increasing thickness of deposited material on the shutter. The deposited material can accumulate to such thicknesses as to cause shutter actuation problems (sluggish or locked behavior) and can even touch the cold surfaces surrounding the shutter, forming a "solidified material weld" between the shutter and the cold surfaces, preventing shutter actuation. The blade is typically actuated via a linear retraction/insertion mechanism or a rotary motion along an arc path substantially less than 360°, typically from 90° to 180°. Closing an open shutter requires the shutter to reversely traverse the path it traveled during its opening cycle, which is a slow and often unwieldy process.

Likewise, in a rare number of effusion cells, a plunger style valve is used to plug and then open the effusion cell crucible's cylindrical tube, so as to cut off and then restore the molecular flux. Such a design allows for a heated valve body, which minimizes the material accumulation and provides a more positive closing, which lowers the amount of flux "leaking" past the valve/shutter. However, even these plunger valve methods of flux modulation require the same path to be reversely traversed, resulting in slow flux modulations similar to the external shutter configurations. These methods of molecular flux interruption were designed to simply start and stop the beam occasionally and are known in the MBE field to produce difficulty when rapid, frequent shutter/valve actuations are required. Methods that require rapid flux modulations include the growth of multiple layers of thin alternating compositions known as superlattices or when supplying frequent pulses of metal to increase surface migration as found in metal-modulated epitaxy (MME) processes, such as those disclosed in, for example, U.S. Pat. No. 9,142,413 titled "Systems and Methods for Growing a Non-Phase Separated Group-III Nitride Semiconductor Alloy." Thus, neither the exterior-mounted "blade style" shutter nor the internally mounted "plunger style valve" can provide the needed speed of actuation desirable when rapid pulse-modulated flux growth is required. These temporal constraints of the shutter/valve systems are exacerbated as the deposition rate increases. For example, in the MME case, shutter actuation may be every 2 seconds for a growth rate of ~1-2 μm/hour, but increase in frequency to every 0.1 to 0.2 second for a growth rate of ~10-50 μm/hour.

One of the primary reasons for using an MBE system is to maintain an ultra-high vacuum background to minimize the incorporation of undesirable impurities. Most often, these impurities are in the form of undesirable oxygen and carbon gases, primarily from heated metals that act as near infinite sources of these undesirable contaminant gases. Extreme care is given to the maintenance and operation procedures to ensure very low base pressures are achieved daily. For example, a commercial MBE system used to grow III-Nitride materials may commence each operational day with a base pressure of ~6-8×10$^{-11}$ Torr (near the lower limit of what can be read by an ion gauge pressure sensor). However, as soon as any of the effusion cells or substrate heaters are increased to their operational temperature from idle values (about 200° C.), the base pressure in the system may rise from this quiescent value to as high as 10$^{-9}$ Torr (and, momentarily, even higher).

MBE is performed using effusion cells heated by resistive metal filaments and substrate holders typically made from metallic Ta, W, or zirconia-stabilized Pt. These resistive metal filaments, ceramic parts holding the resistive metal filaments, and gas trapping rolls of metal used to reflect heat and minimize the amount of heat escaping the effusion cell or substrate heater, however, can result in introduction of impurities into the evaporate flux. Metals are an infinite source of carbon- and oxygen-bearing gases and tend to outgas CO, $CO_2$ and $O_2$ gases, and other undesirable elements, which need to be pumped away or they will be incorporated into the growing film. Furthermore, the substrate heaters and effusion cells are in direct line-of-sight to the growth substrates. Thus, all the elaborate cryoshields and gettering pumps, useful for scattered or desorbed gases, have little effect on lowering these gas concentrations before they encounter the growth substrates.

BRIEF SUMMARY

In some embodiments, the present disclosure includes an effusion cell that comprises a crucible for containing material to be evaporated or sublimated, a delivery tube configured to deliver evaporated or sublimated material originating from the crucible into a chamber, a supply tube extending from the crucible, the supply tube located and configured to trap condensate originating from the evaporated or sublimated material and to deliver the condensate back to the crucible, and at least one heating element located and configured to heat material in the crucible so as to cause evaporation or sublimation of the material and flow of the evaporated or sublimated material through the delivery tube and out from the effusion cell. The effusion cell is configured such that the crucible can be filled with the material to be evaporated or sublimated without removing the effusion cell from the process vacuum chamber.

In yet additional embodiments, the present disclosure includes semiconductor substrate processing systems that include one or more such effusion cells.

BRIEF DESCRIPTION OF THE DRAWINGS

FIG. 5A is an exploded perspective view of a supply tube and a plurality of baffles (that may be disposed within the supply tube) of the effusion cell of FIGS. 2A, 2B and 4.

FIG. 5B is a top perspective view of one of the baffles shown in FIG. 5A.

FIG. 5C is a bottom perspective view of one of the baffles shown in FIG. 5A.

FIG. 6A is a perspective view of an RF coil assembly of the effusion cell of FIGS. 2A, 2B and 4.

FIG. 6B is an enlarged, partial top perspective view of the RF coil assembly shown in FIG. 6A.

FIG. 6C is a partial side view of a lower portion of the RF coil assembly shown in FIGS. 6A and 6B.

FIG. 9A is a perspective view illustrating a delivery tube and associated components of the effusion cell of FIGS. 2A, 2B and 4 shown separate from other components of the effusion cell.

FIG. 9B is an exploded view of various components of the effusion cell shown in FIG. 9A.

FIG. 10A is a perspective view of a shutter assembly, guide tube, and nozzle of the effusion cell of FIGS. 2A, 2B and 4.

FIG. 10B is an enlarged partial perspective view of the shutter assembly, guide tube, and nozzle shown in FIG. 10A.

FIG. 10C is an enlarged partial perspective view of the shutter assembly, guide tube, and nozzle shown in FIG. 10A taken from a different perspective than that of FIG. 10B.

FIG. 11A is an exploded perspective view of the shutter assembly and nozzle of the effusion cell of FIGS. 2A, 2B and 4.

FIG. 11B is a perspective view of the shutter assembly and nozzle of FIG. 11A shown in the assembled state.

FIG. 11C is another exploded perspective view of the shutter assembly and nozzle like that of FIG. 11A but taken from a different perspective than that of FIG. 11A.

DETAILED DESCRIPTION

Figure 1A:
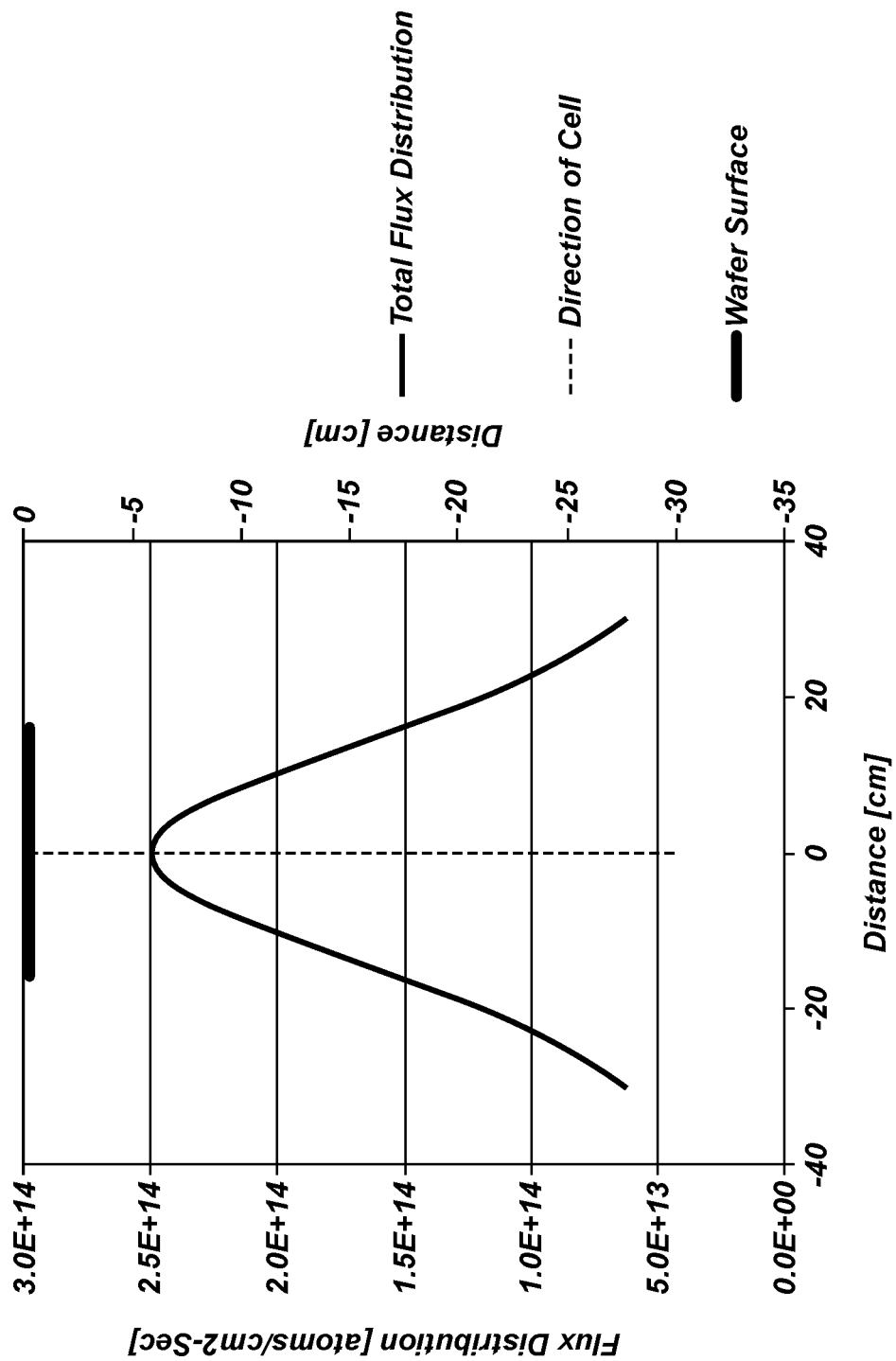
FIG. 1A is a graph illustrating a flux distribution provided by an effusion cell as a function of radial distance from a center of the effusion cell and substrate for a first separation distance between the effusion cell and substrate.
Figure 1B:
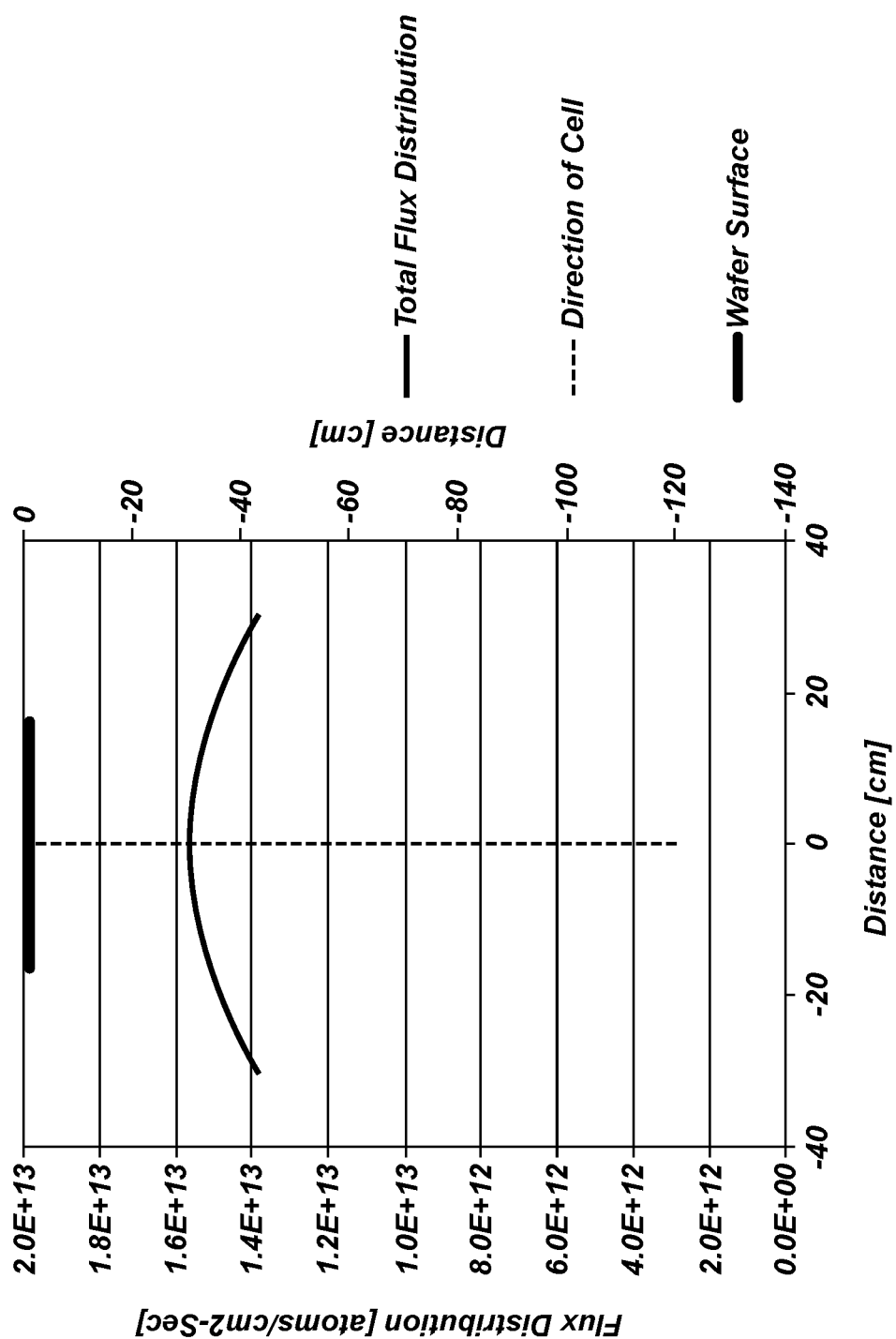
FIG. 1B is a graph illustrating a flux distribution provided by an effusion cell as a function of radial distance from a center of the effusion cell and substrate for a second separation distance between the effusion cell and substrate.

The illustrations included herewith are not meant to be actual views of any particular effusion cells or semiconductor substrate processing systems, but are merely idealized representations that are employed to describe embodiments of the present disclosure. Elements and features common between figures may retain the same numerical designation.

Embodiments of effusion cells of the present disclosure can be utilized in the application known as "Molecular Beam Epitaxy" ("MBE") or, more generally, in the vacuum deposition of thin and thick films generally known as "physical vapor deposition" ("PVD"), or in any other processing system wherein an enclosed vacuum chamber is used to process one or more substrates, and wherein an effusion cell is used to provide an evaporate into the vacuum chamber for processing of the substrate(s). Because the operational pressure range of the embodiments of effusion cells described herein may be higher than that defined as "Molecular Flow," the effusion cell can operate with improved flexibility relative to previously known effusion cells, specifically at higher evaporate or ambient pressures and, thus, the effusion cells may be employed in processing systems other than MBE systems. In contrast to traditional "MBE-style" sources, the evaporate flux provided by embodiments of effusion cells described herein is adjusted primarily by the variation of the duty cycle and duration of rapid pulsing of the flux, and only slowly responds to flux variations resulting from temperature changes. Thus, thicker, more robust crucibles, less prone to fracture, may be utilized in embodiments of the present disclosure. The temperature of the crucibles can also be varied to effect flux changes, but at a slower rate, with higher thermal stability when a constant temperature is desired. The effusion cells described herein can have utility in deposition chambers and processes in which deposition is carried out under medium vacuum, high vacuum (HV), or ultra-high vacuum (UHV) pressure ranges. In general, the primary desirable features of a deposition system are high deposition rates, excellent uniformity, wide operational pressure range, low impurity incorporation and good control over composition of a multi-component film. In addition to all these desirable features, the disclosure includes the capability of reducing spitting of droplets and providing rapid temporal response of the flux at high deposition rates with in-situ material reloading capability. Furthermore, embodiments of effusion cells disclosed herein utilizes a unique "out of vacuum" reloading design that allows for in-situ reloading without exposing the system to atmosphere, which removes material reloading from among the factors limiting the campaign length of the system. Additionally, embodiments of effusion cells of the present disclosure are capable of relatively rapid modulation of the molecular flux (e.g., activation and deactivation of the flux interruption mechanism). Embodiments of effusion cells as described herein reduce the outgassing caused by previously known effusion cell designs, and may even minimize or even eliminate the source of such harmful gases by removing all unnecessarily heated line of sight hot metals from the design.

Another advantage of embodiments of effusion cells according to the present disclosure is reduction in effusion cell cost. Specifically, previously known resistively heated effusion cells include expensive tantalum, platinum, and other rare metals in the form of resistive heating filaments and heated heat reflectors. Oxide-resistant effusion cells employ expensive zirconia-stabilized platinum or iridium to avoid filament oxidation. Embodiments of effusion cells of the present disclosure may be free of such expensive, impurity outgassing metals, and may be formed of high purity, widely available materials standard in MOCVD (metal-organic chemical vapor deposition) and Si-based semiconductor manufacturing systems. Embodiments of effusion cells of the present disclosure may not include any such resistive heating filaments or heated heat reflectors comprising tantalum, platinum, or other rare metals.

Figure 2B:
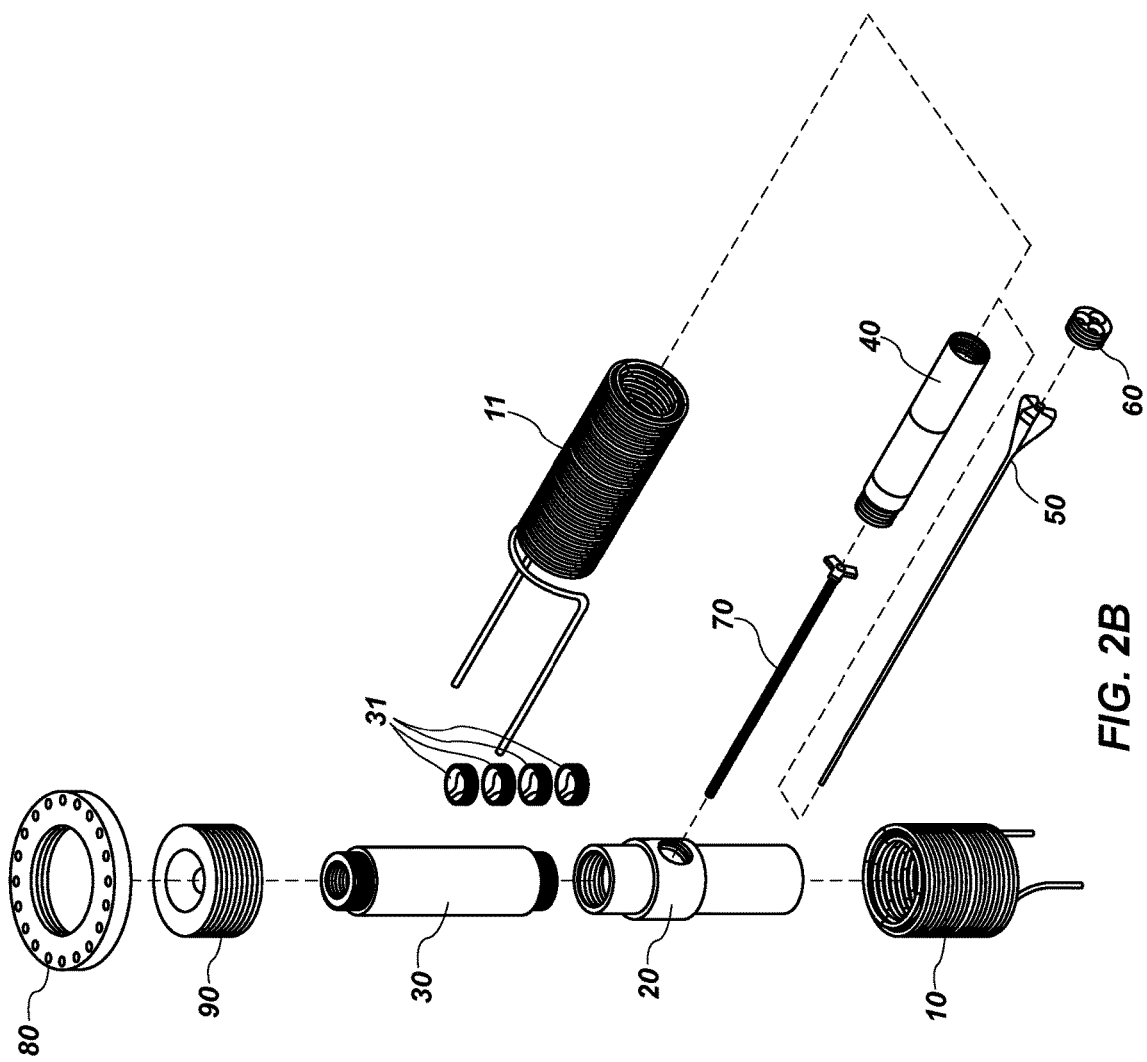
FIG. 2B is an exploded perspective view of the effusion cell shown in FIG. 2A.
Figure 2A:
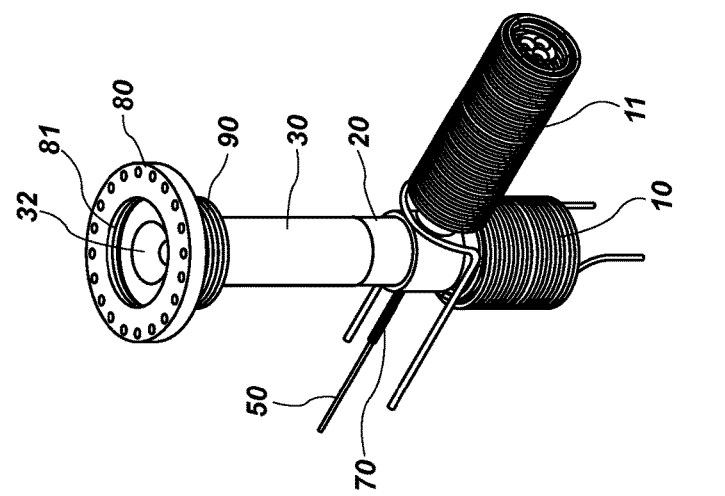
FIG. 2A is a perspective view of an embodiment of an effusion cell of the present disclosure in an assembled state separate from a system with which the effusion cell is employed, and without an external vacuum chamber encasement.

FIG. 2A illustrates an effusion cell according to an embodiment of the present disclosure in an assembled state, and FIG. 2B is an exploded view of the components of the effusion cell of FIG. 2A. As shown in FIGS. 2A and 2B, the effusion cell includes an RF induction coil 10 that heats a thick, mechanically robust permanent (i.e., not material interchangeable) crucible 20. The effusion cell further includes a combination evaporate material supply and mechanical support tube 30 with internal offset baffles 31. The effusion cell further includes another RF induction coil 11 that heats a delivery tube 40, which is fitted with a high-speed 360° rotational shutter assembly 50 and a replaceable nozzle 60 assembled inside the delivery tube 40. A guide tube 70 mechanically supports the shutter assembly 50 and centers it within the delivery tube 40. The thick-walled crucible 20 is suspended mechanically from the supply tube 30 with the baffles 31 therein. The supply tube 30 acts to provide a substantial conductive temperature gradient that condenses vapors into liquids. The liquids are trapped on the baffles 31 and allowed to drip back into a source reservoir inside the crucible 20 mounted below. The supply tube 30 with internal baffles 31 also has a second open end 32, but does not allow significant amounts of vapor to escape the open end 32. The supply tube 30 is affixed to a standard double-sided vacuum flange 80 via a threaded connector 81 to a thermal isolator 90. The vacuum flange 80, optionally, can be cooled to dissipate the conducted heat via water, liquid nitrogen ($LN_2$), or a variety of well-known coolant liquids via methods well known in the art. The thermal isolator 90, optionally, can be drilled, made of porous materials and/or machined so as to limit the thermal resistance, controlling the amount of heat flow to the vacuum flange 80. Additionally, the length of the supply tube 30 can be adjusted to achieve a desired heat conduction to the vacuum flange 80. In this way, the top end of the supply tube 30 can be maintained at an appropriate temperature so as to ensure that the evaporate present in the supply tube 30 condenses and is returned to the crucible 20. The thermal isolator 90 can optionally have a conical or funneled internal shape so as to aid in material re-loading as described below.

Figure 3A:
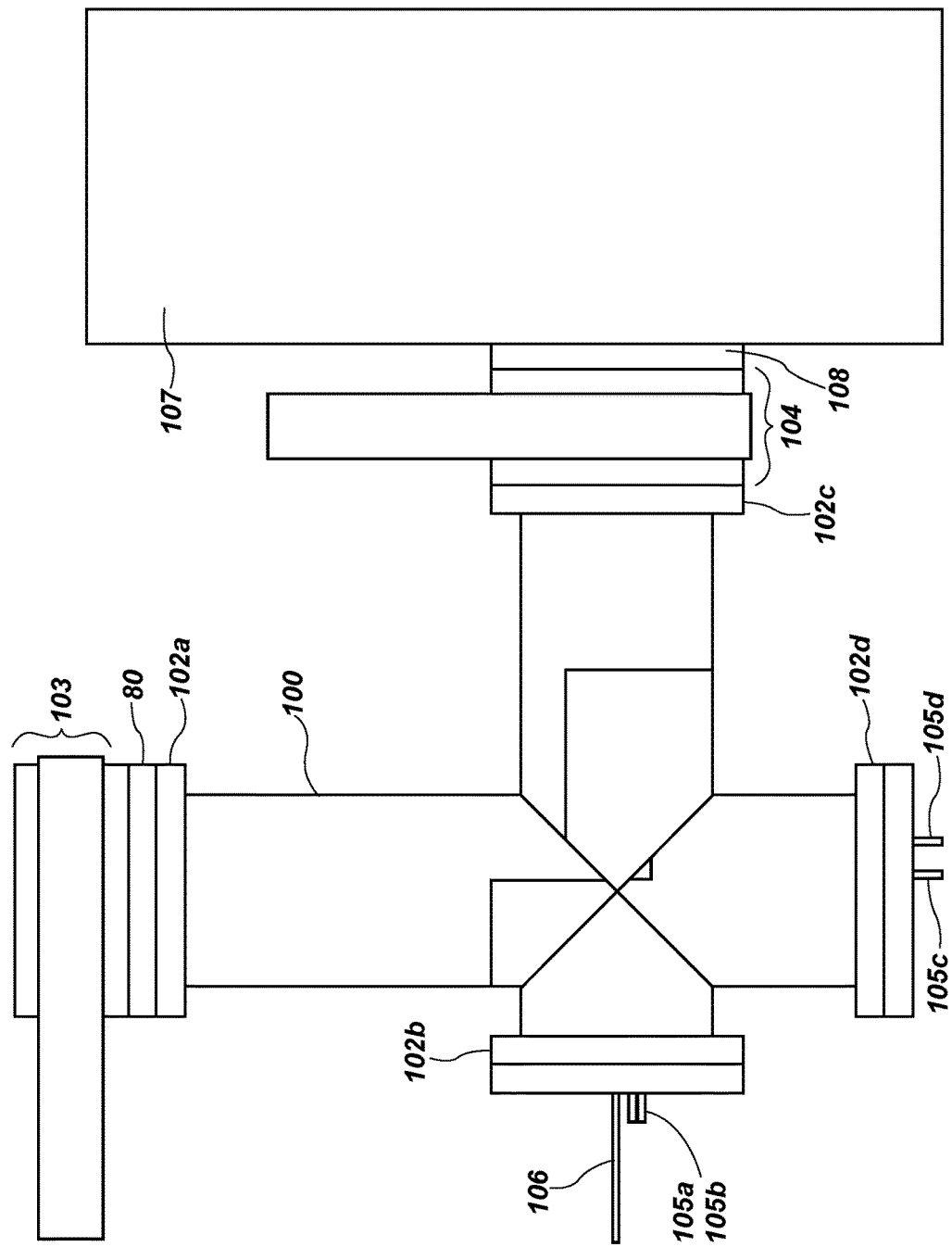
FIG. 3A is a side view of the effusion cell of FIGS. 2A and 2B that may be employed with an external vacuum chamber encasement attached to the vacuum chamber.
Figure 3B:
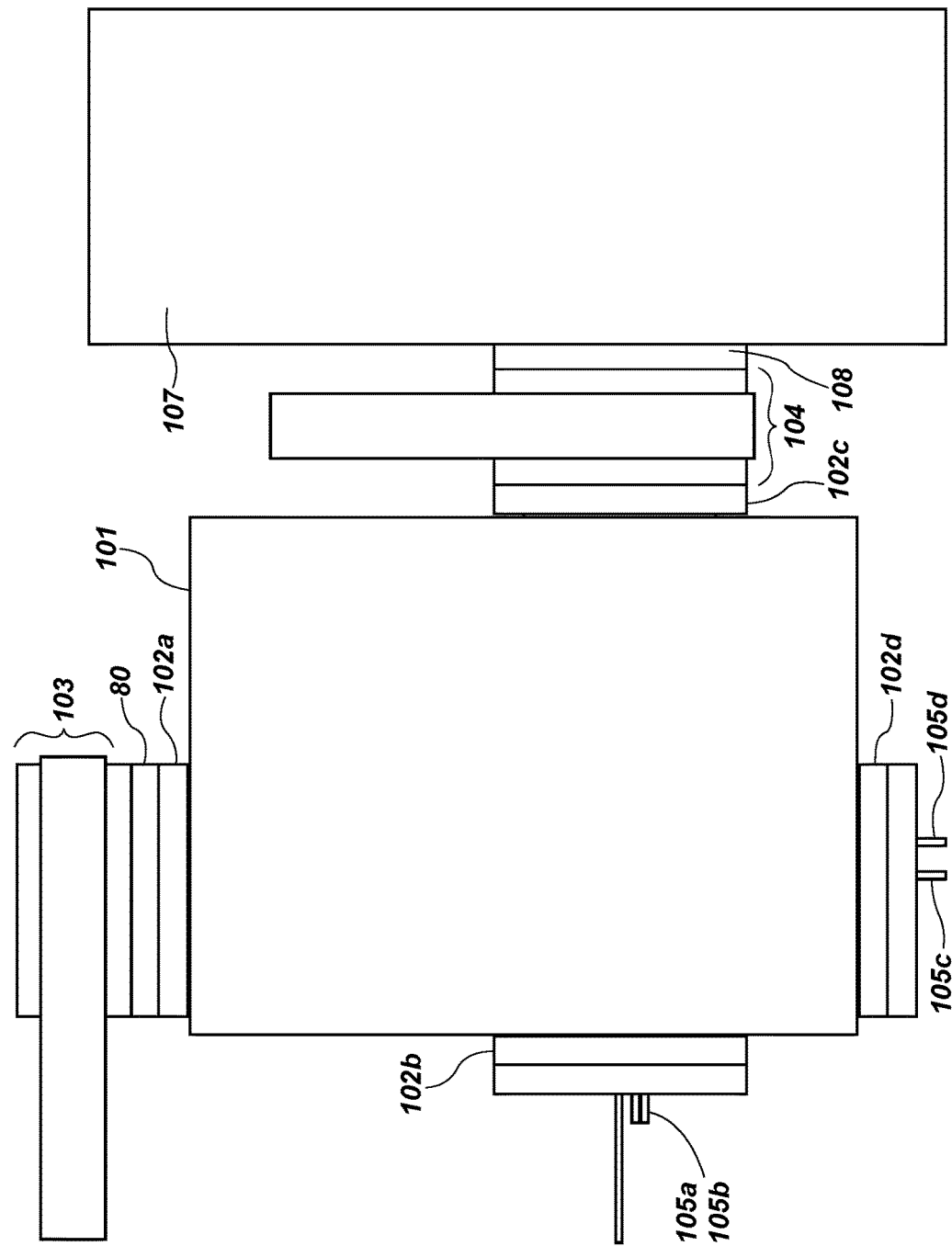
FIG. 3B is a side view of another embodiment of the effusion cell of FIGS. 2A and 2B with an external vacuum chamber encasement attached to the vacuum chamber.

The entire effusion cell may be mounted inside a vacuum chamber encasement as illustrated in FIGS. 3A and 3B. The vacuum encasement chamber can have any variety of shapes. As non-limiting examples, the vacuum encasement chamber may include a cylindrical chamber 100 (e.g., a tube) as shown in FIG. 3A, or a rectangular chamber 101 as shown in FIG. 3B. The double-sided vacuum flange 80 is mated between one of four vacuum flanges 102a, 102b, 102c, 102d affixed to the vacuum chamber and an optional vacuum gate valve 103. This vacuum gate valve 103 isolates the effusion cell from a reloading chamber as described with reference to FIG. 4 below. An optional vacuum gate valve 104 may isolate the effusion cell from the process chamber 107 in which the evaporate material is injected. The vacuum gate valve 104, if present, may be attached to the process chamber 107 via a vacuum flange 108. Rotary mechanical feed-throughs 106, many of which are well known in the art, are connected to the shutter assembly 50 (FIGS. 2A and 2B) for manipulation thereof. Likewise, four RF vacuum feed-throughs 105a, 105b, 105c, 105d are provided to establish the RF induction coils 10, 11 (FIGS. 2A and 2B) supply and return connections feeding and returning both electrical power and liquid cooling to maintain the RF induction coils 10, 11 at a temperature sufficiently low so as to minimize undesirable outgassing.

The vacuum chamber may optionally include a gas feed-through. This gas feed-through may provide a means of adjusting the local pressure emanating from the effusion cell, which can be helpful in controlling the mean free path between collisions of the evaporate material and, thus, tune the directionality of the evaporate material in a way not found in previously known effusion cells.

The vacuum chamber may also contain various sensors, such as temperature sensors, pressure sensors, etc., and optionally may include additional pumping ports so as to allow "differentially pumping" of the source, a method known in the art.

The supply/supply tube 30 can be used for in-situ material re-loading via the vacuum valve 103 and a separate material load lock chamber that can be pre-purged, baked and, thus, purified before opening the valve 103 so as to open a passageway between the load lock chamber and the source loading tube. Once valve 103 is open, the pre-outgassed replenishing material can be loaded into the thermal isolator 90, which funnels the materials into the supply tube 30 and into the crucible 20.

While the effusion cell can be installed inside a sufficiently large vacuum system, such as the GEN200 MBE System or the GEN2000 MBE System, which are commercially available from Veeco Instruments Inc. of Plainview, N.Y., or similar "large port" models from this or other vendors, the overall size of the effusion cell is relatively larger than previously known effusion cells and may be installed for operation from a fully external position, in contrast to prior effusion cells which are typically installed within the deposition chamber 107. Thus, an isolation valve 104 optionally may be employed between the effusion cell and the deposition chamber when the effusion cell is mounted externally to the deposition chamber 107.

Figure 4:
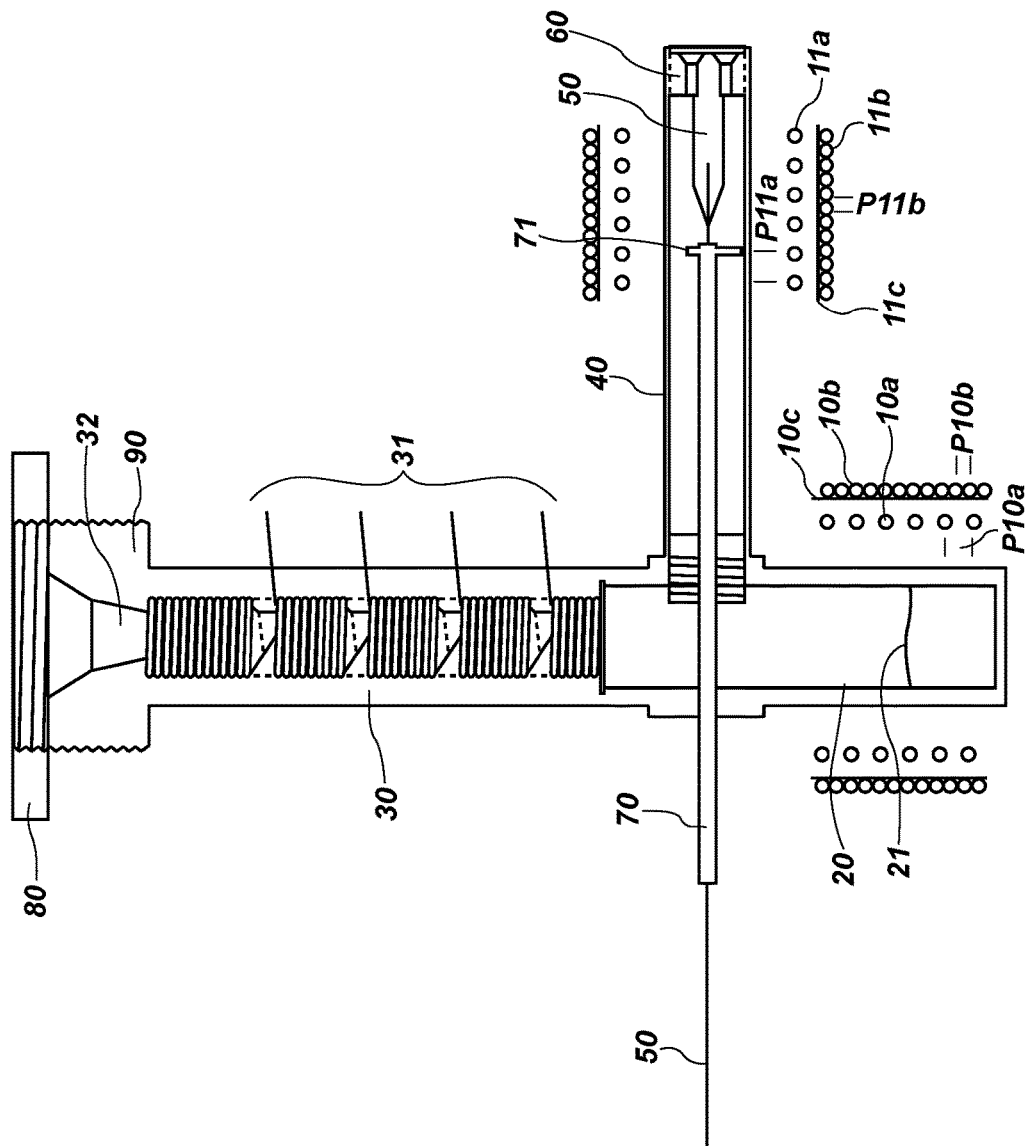
FIG. 4 is a cross-sectional side view of the effusion cell of FIGS. 2A and 2B in the assembled state.

FIG. 4 is a cross-sectional view of the effusion cell of FIGS. 2A and 2B. The effusion cell includes several interconnected thick-walled tubes that include a crucible 20, mechanical support and re-loading supply tube 30 and delivery tube 40. As shown in FIG. 4 and in the exploded view of FIG. 5A, and in FIGS. 5B and 5C, internal to the support/supply tube 30 are several baffles 31a, 31b, 31c, and 31d that allow gravity-fed material to drain down to the crucible 20 reservoir but that restrict the vapor flow upward toward the open end 32 of the tube 30. By creating a temperature gradient along the supply tube 30, condensation of the evaporated material occurs, allowing the condensed liquid evaporate materials to drain back to the crucible 20 reservoir. The thermal isolator 90 (FIG. 4) has an internal funnel shape to aid in material re-loading, directing liquid material into the open end 32 of supply tube 30. Once in the supply tube 30, the liquid material drains through the baffles 31a-31d to the crucible 20 reservoir. The thermal isolator 90 can be machined, drilled, or made of porous materials so as to maintain an adequate temperature at the top of the supply tube 30 so as to allow the loaded material to remain liquefied. Typical melting points of the materials commonly used in applications range from ~27° C. for Ga to ~660° C. for Al to substantially hotter for various transition and ferrous metals. However, even for materials that remain un-melted, solid powder can be used to reload the source. In the applications where neither of these liquid or solid reloading methods is appropriate, the effusion cell may be used without employing the re-loading procedure with opening 32 of supply tube 30 sealed with an appropriate plug.

In some embodiments, during operation, a temperature gradient may be established between the three zones comprising the supply tube 30, the crucible 20, and the delivery tube 40. While the actual temperatures in these areas may vary depending on the evaporate and the process conditions, the temperature in the delivery tube 40 may be at least 200° C. hotter than the crucible 20, and the crucible 20 may be at least 200° C. hotter than the supply tube 30. In some embodiments, the crucible 20 may be heated to temperatures up to approximately 2,200° C. using its respective RF induction coil heating element, and the delivery tube 40 may be heated to temperatures as high as 2,500° C. or more using its respective RF induction coil heating element.

With continued reference to FIG. 4, as previously mentioned, the effusion cell may employ RF induction-heated coils. FIGS. 6A-6C further illustrate the RF induction coils separate from the effusion cell. RF induction coils 10 and 11 may be different in radius. In some embodiments, each of the RF induction coils may include an inner winding 10a, 11a and an outer winding 10b, 11b, as shown in FIGS. 4, 6A and 6B. In other words, each coil 10, 11 may comprise a hollow tube of electrically conductive material, that has an inner winding 10a, 11a and an outer winding 10b, 11b. FIG. 6B depicts the pitch P10a, P11a of the inner winding 10a, 11a, and the pitch P10b, P11b of the outer winding 10b, 11b, where the pitch is defined as distance between two adjacent sections of the coil in the winding. Thus, each RF induction coil 10, 11 may include an inner helical winding within an outer helical winding, wherein the inner winding 10a, 11a has a pitch P10a, P11a greater than the coil diameter such that adjacent sections of the coil in the winding do not contact one another. These pitches, P10a and P11a may vary along the length of the coil and may be more dense toward one end so as to concentrate more electromagnetic flux preferentially where more heating is desired. As alternating current is caused to flow through the inner winding 10a, 11a, a fluctuating magnetic field is generated in the volume of space surrounded by the inner winding 10a (which is occupied by the crucible 20 and the material to be evaporated or sublimated) or the inner winding 11a (which is occupied by the delivery tube 40 and internal shutter assembly 50 and nozzle 60). The fluctuating magnetic field induced current flow within the crucible 20, or delivery tube 40 as well as the material to be evaporated or sublimated, and in other material within the volume, are then resistively heated by the current flow therein. The diameter of the inner winding 10a, 11a, the coil pitch P10a, P11a and the total number of turns in the winding combine to establish an inductance of the coils 10, 11 and can be matched to the crucible 20 and delivery tube 40 load impedance, either by empirical methods or by calculations known in the art.

Water or another cooling liquid or fluid may be caused to flow through the coils 10, 11 during operation of the effusion cell, so as to cool the coils 10, 11 and absorb thermal radiation that is emitted from the crucible 20 and the material contained therein.

Moreover, while the inner windings 10a, 11a have a distinct gap or space between adjacent sections of the coil for the desired inductance for a given diameter and material being heated, the outer winding 10b, 11b, which is the "return winding," is helically wound so as to have no gap between adjacent sections of the coil, resulting in an electrical short along the walls of the outer winding in the direction parallel to the axis of the coils 10, 11. Optionally, the electrical contact between the adjacent sections of the coil in the outer windings 10b, 11b may be enhanced by welding, soldering, brazing or tying the coils together to form a solid outer water-cooled shield that contributes very little to the induction process. Thus, the coils 10, 11 may comprise a water-cooled outer shell that is capable of removing a majority of heat radiated from the crucible 20 and material therein, preventing any extraneous heating of the chamber. These heat-shield outer windings 10b, 11b form an outer coil useful for heat shielding of the vacuum chamber. Outer coils 10b, 11b may have a pitch P10b, P11b equal to the coil diameter such that each turn of the coil touches the next, adjacent turn, forming an electrical short vertically along the outer windings 10b, 11b.

Since substantial radiant heat can emanate from the crucible 20 and delivery tube 40 enhancing heat loss, optionally, the outer windings 10b, 11b can be augmented by any number of added heat reflective canisters 10c, 11c or multilayered foils in direct contact, welded, brazed or tied to the outer windings 10b, 11b and made from materials known in the art to reflect heat efficiently. These materials include steel, Ta, Mo, Cu, Au, Ag, Ni, Al, Cr and/or various oxide-, fluoride- or nitride-coated versions of the same. Unlike a standard effusion cell, the heat shielding is maintained at a low temperature by the eminent contact to the outer windings 10b, 11b.

As described above, the RF induction coils 10, 11 comprise a water/coolant-cooled and electrically conductive coil to heat the crucible 20 and material contained therein via RF induction heating. In this configuration, the RF induction coils 10, 11 efficiently heat the crucible 20 and material contained therein and the delivery tube 40 and components contained therein without significantly heating other components of the effusion cell, reducing undesirable outgassing relative to previously known effusion cells. In the limited case where the material contained in the crucible 20 is a sublimation material (Mg, As, P, etc.), the crucible 20 could optionally be eliminated as long as the effusion cell includes a means for holding the solid material in place within the RF induction coil (although a crucible 20 will most likely still be used to prevent undesirable stray evaporation). In all cases, there is no need for heated Ta (or W, zirconium-stabilized Pt, etc.) filaments because the RF energy is directly coupled to the evaporating material and through a high-purity ultra-dense graphite crucible (or other suitable material such as SiC, TaC, BeO, PBN, BN, AlN, $Al_2O_3$ or similar material commonly used as crucible materials). These ultra-dense graphite crucibles are routinely used in MOCVD systems and have been adopted as of late in thin-crucible MBE applications with proven performance, equivalent or better than their PBN ceramic counterparts. However, in this case, the crucible 20 is constructed of thick walls (0.036"≤t≤1") for mechanical integrity instead of the traditional thin-walled (t≤0.035") replaceable crucibles. These graphite, ceramic, metal, metal-carbide, metal-nitride, metal-boride or similar crucibles can be lined with various coatings for specific application compatibility (for example, TaC, graphitic carbon, silicon nitride or AlN for Al and SiC for oxygen environments, among many other options well known in the art). Alternatively, when deemed acceptable, as in the case of the growth of oxide materials wherein outgassing is less a concern, the crucibles can be made from Ta, Mo, W, Nb, Ti or other high-purity, thick-walled metals.

It should be noted that RF heating has not previously been used in an MBE system because of required space. MBE systems have always had narrow effusion cell openings designed to trap the outgassed impurities. Thus, small openings in cryopanels filled with liquid nitrogen or antifreeze mixtures have been used. If one were to place an RF cell in one of these openings, it most likely would not fit and it would couple to the cryoshroud and boil away the liquid nitrogen. Thus, effusion cells in accordance with the present disclosure may be used in a large bore vacuum deposition or MBE system, or in an externally mounted configuration. This is possible because the new RF effusion cell will not be outgassing impurities from the heated metals, only the heated material and crucible.

Figure 7A:
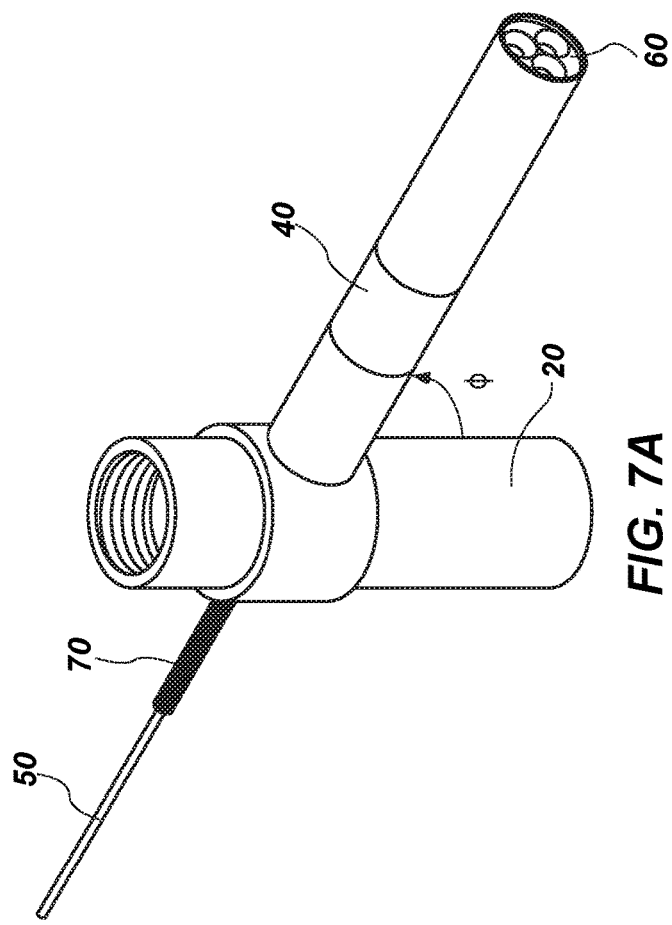
FIG. 7A is a perspective view illustrating a delivery tube and associated components of the effusion cell of FIGS. 2A, 2B and 4 shown attached to a crucible of the effusion cell of FIGS. 2A, 2B and 4, wherein other components of the effusion cell are omitted.
Figure 7B:
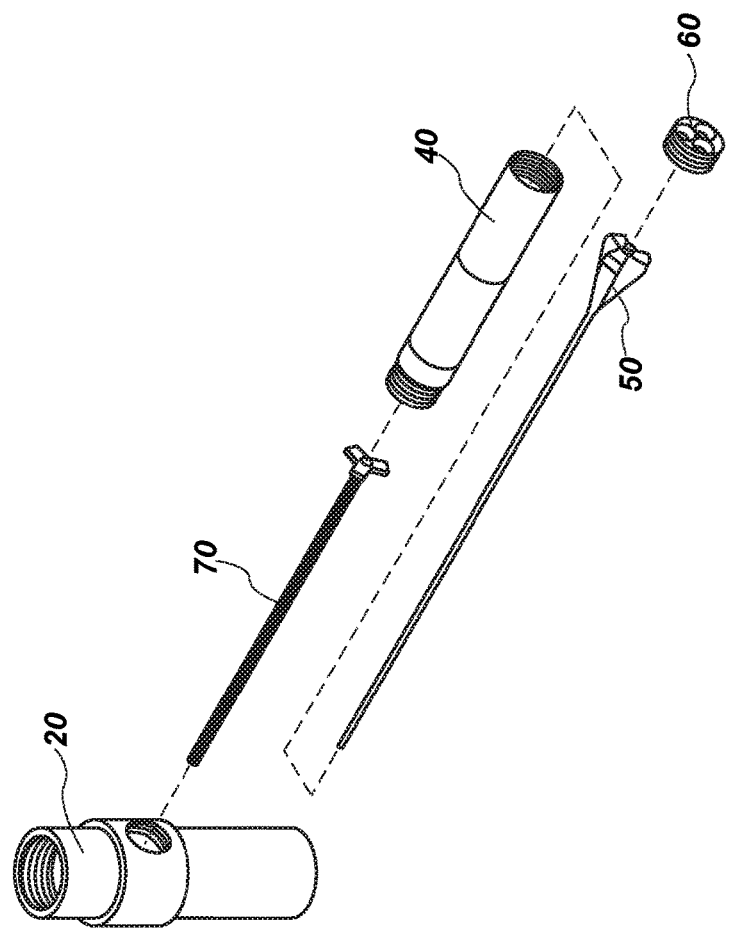
FIG. 7B is an exploded view of various components of the effusion cell shown in FIG. 7A.
Figure 8B:
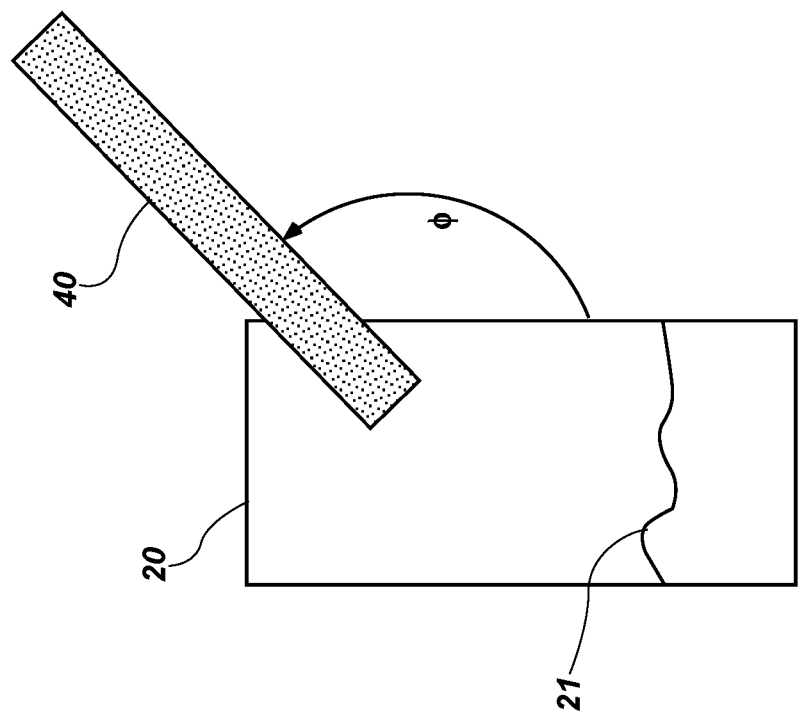
FIG. 8B is a simplified and schematically illustrated cross-sectional side view illustrating a crucible and delivery tube in another configuration that may be employed in accordance with embodiments of effusion cells of the present disclosure.
Figure 8A:
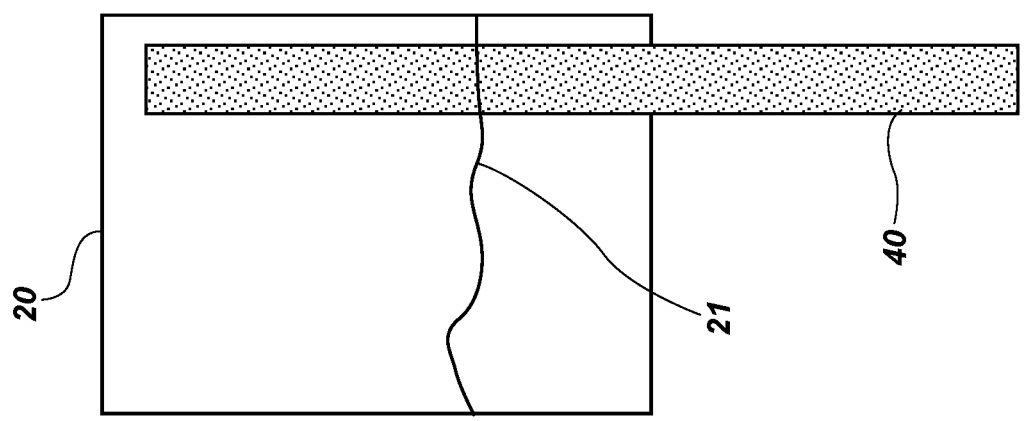
FIG. 8A is a simplified and schematically illustrated cross-sectional side view illustrating a crucible and delivery tube in a configuration that may be employed in accordance with embodiments of effusion cells of the present disclosure.

Referring to FIGS. 4, 7A, 7B, 8A and 8B, the effusion cell also includes a delivery tube 40. The axis of the delivery tube 40 may be oriented at an angle Φ to the axis of the crucible 20 area holding the evaporate material 21, and may be fitted with an RF-heated high-speed rotational valve 50 and removable nozzle assembly 60. FIGS. 7A and 7B further illustrate the delivery tube 40 and associated components. Referring to FIGS. 8A and 8B, the angle Φ of the delivery tube 40 relative to the crucible 20 may be any angle between 0° and approximately 180°, but angles between 0° and 135° may minimize spitting from the effusion cell. At angles between 0° and 135°, the "boiling" molten liquid source material 21 in the crucible 20 spits very few droplets into the delivery tube 40 as the tube 40 is not aligned with the molten material 21 contained in the crucible 20. FIG. 8A illustrates an embodiment in which the angle Φ of the delivery tube 40 relative to the crucible 20 is about 0° (i.e., the delivery tube 40 is parallel to the crucible 20), and FIG. 8B illustrates an embodiment in which the angle Φ of the delivery tube 40 relative to the crucible 20 is about 90° (i.e., the delivery tube 40 is perpendicular to the crucible 20). Since the delivery tube 40 is not in the line-of-sight with the molten source material 21 in the crucible 20, and since the delivery tube 40 is designed with its own independent RF induction heating source 11, which can be operated so as to make the delivery tube 40 hotter than the crucible 20, any small number of stray droplets "spit" into the delivery tube 40 are re-vaporized before exiting the tube 40 through the valve 50 and nozzle assembly 60.

Equations 1) through 9) may be used to define acceptable dimensions of the crucible 20, delivery tube 40, valve 50 and nozzle assembly 60 by defining a suitable combined conductance for the desired molecular flux flow in any particular deposition system. Thus, shorter and/or wider delivery tubes 40 provide more flux, while longer and/or narrower delivery tubes 40 restrict and reduce the flux. Likewise, the combined conductance according to Equations 3) and 4) imply similar relationships for the tubular and orifice conductances of the valve 50 and nozzle 60.

Some critical joints where liquid could otherwise escape can be coated on the outside of the joint so as to seal the joint. For example, the union of the crucible 20 and delivery tube 40 is made via a threaded connection with an optional outer graphitic coating (or other materials of similar variety as the liner coatings discussed above) to form a liquid-tight and gas-tight seal. Such a joint is mechanically sound by the threaded connection and liquid tight via the external coating. The threads of the union incorporate a gas port relief (a cut along the threads) and a shorter male thread than female socket so as to eliminate trapped gases along the threads or in the base of the mechanical union. An assembly of this description is mechanically attached via the threads and, thus, can support larger mechanical and thermal loads but is sealed to gas/liquid leakage by the added outer graphitic (or other similar) coatings. This leak-proof seal is especially necessary when Φ equals or approaches 0°, such that the union of the crucible 20 and the delivery tube 40 will be in contact with the molten liquid 21.

As shown in FIG. 4, the end of the delivery tube 40 contains a nozzle 60 fitted to the delivery tube 40 via a threaded connection of similar specifications as described for the crucible 20 delivery tube 40 union. FIGS. 9A and 9B also illustrate the nozzle 60. The nozzle 60 contains one or more constricted "openings" 61A, 61B, and 61C that can, in practice, be orifices or tubes that, when aligned with the "openings" 51A, 51B, 51C (again orifices, slots as pictured in FIG. 9B or tubes) in the valve 50, allow molecular flux to flow and, when misaligned, interrupt the molecular flux. The speed of the flux interruptions is defined by:

$$\text{Flux Speed} = 60/(N \times \text{rpm}), \qquad \text{Equation 13)}$$

where Flux Speed is the time of flux modulations per second, N is the number of circularly arranged orifices or tubes located in the nozzle with an equal number of orifices or tubes in the valve and rpm is the number of revolutions per minute for the rotation of the valve. In FIG. 9B, N=3 in this example.

Thus, for a modest 200 rpm valve rotation, the modulation of the flux can be accomplished at 0.1 second with only three nozzle and valve openings. If higher flux speeds are needed, either higher rpm or more openings in the nozzle and valve can be used. The spacing and number of openings in both the valve 50 and nozzle 60 can be varied so as to adjust the speed and duty cycle of the flux modulation. For example, the flux may be delivered within a range from about 0.001 second to about several seconds or held open for a constant supply of flux. The valve 50 and nozzle 60 need not have the same number of openings unless a 50% duty cycle is required.

As detailed in FIGS. 10A and 10B, the shape of each of the orifices 61 on the nozzle 60 is generally a positive draft on the outside with the drafts 61 approximating a 25°-45° angle to the delivery tube 40 axis. The specific shape and taper of each orifice can be adjusted to create a more directed or diffuse molecular flux as is well known to those in the art. As detailed in FIG. 9B, the nozzle also includes a rotational hub 52 on which the valve 50 can rotate. This hub can be either a tapered curve to the nozzle on the internal side and/or an optional cylindrical post 52 for the nozzle 60 to encompass. Finally, a suitable wear-compatible and evaporate-material-compatible coating, such as high density graphite, TaC, SiC, AlN, or other materials, can be optionally applied to the contact sides of the valve 50 and nozzle 60.

The source contains independently controllable and RF induction coils 10, 11 so as to allow independent control of the temperature of the delivery tube 40, nozzle 60 and valve assembly 50 compared to the temperature of the crucible 20 containing the evaporate material. This allows the delivery tube 40, valve assembly 50 and nozzle 60 to be operated at excessively high temperatures so as to prevent condensation and the resultant spitting and/or clogging. The valve assembly 50 may have an attached valve shaft and may be fitted into a long valve shaft tube 70. The long valve shaft tube 70 is screwed through the crucible 20 wall forming a leak-proof connection as described previously. While the valve assembly 50 to valve shaft-tube opening 70 inside the delivery tube 40 is not leak proof, the tight clearance and long length of the valve assembly 50 shaft and long valve shaft tube 70 forms a conductance limitation in the manner described by Equations 1) through 9), which forms a conductance restriction preventing vapor leakage out of the valve assembly 50 shaft-valve shaft tube 70 gap. The valve shaft tube 70 may also have a mechanical centering support 71 inside the delivery tube 40 for alignment of the valve assembly 50 to the nozzle 60. Any number N of nozzle openings 61 can be utilized, but nozzle openings greater than 12 result in either large source delivery tube 40 sizes or reduced flux because the nozzle opening 61 diameter decreases the conductance according to Equations 1) through 9). In practice, any size source delivery tube 40 diameter is allowable but dimensions less than or equal to the area to be deposited may be beneficial. Additionally, while the examples given herein are cylindrical in nature, any geometrical shape is possible with no loss of generality. In particular, it may be useful to have effusion cells that have flattened delivery tubes 40, nozzle openings 61 that are not circularly concentric or that have multiple size, shape and location openings so as to better shape the molecular flux profile, or multiple delivery tubes 40 originating from a single crucible 20 or from multiple independently controlled crucibles 20. Additionally, multiple temperature sensors, thermocouples, resistance temperature devices or similar sensors useful for monitoring the crucible, delivery tube and thermal isolator temperatures, among other locations, may be incorporated.

Finally, the optional injected gas port on the vacuum encasement chamber body can be used to increase the local pressure of the evaporated material and provide a "curtain gas" wherein the evaporated material is surrounded by a beam of gas of either active or inactive nature. Inactive gas may serve to isolate the evaporated material from other reactive gases in the chamber or to decrease the directionality of the molecular beam by decreasing the mean free path ($\lambda$) between collisions. An active gas curtain may allow a desirable gas phase pre-reaction to occur before the evaporated material encounters the deposition substrate or might be used as a reactant gas for a two-component deposition, reacting on the substrate.

Additional non-limiting example embodiments of the present disclosure are set forth below:

Embodiment 1: An effusion cell, comprising: a crucible configured to contain therein a material to be evaporated or sublimated within the effusion cell; a delivery tube configured to deliver evaporated or sublimated material originating from the crucible out from the effusion cell and into a chamber; and at least one radio-frequency (RF) heating element located and configured to heat material contained in the crucible so as to cause evaporation or sublimation of the material in the crucible and flow of the evaporated or sublimated material through the delivery tube and out from the effusion cell.

Embodiment 2: The effusion cell of Embodiment 1, wherein the crucible comprises one or more walls, each wall of the one or more walls having an average wall thickness greater than or equal to 0.036 inch.

Embodiment 3: The effusion cell of Embodiment 2, wherein each wall of the one or more walls has an average wall thickness greater than or equal to 0.25 inch.

Embodiment 4: The effusion cell of Embodiment 3, wherein each wall of the one or more walls has an average wall thickness greater than or equal to 0.50 inch.

Embodiment 5: The effusion cell of any one of Embodiments 1 through 4, wherein the effusion cell is configured such that the crucible can be filled with the material to be evaporated or sublimated without removing the source from a process vacuum chamber.

Embodiment 6: The effusion cell of Embodiment 5, wherein the effusion cell is configured such that the crucible can be filled with the material to be evaporated or sublimated without interrupting a processing operation carried out using the effusion cell and without releasing a vacuum within the chamber into which the evaporated or sublimated material originating from the crucible is delivered out from the effusion cell through the delivery tube.

Embodiment 7: The effusion cell of any one of Embodiments 1 through 6, wherein the crucible comprises a material selected from the group consisting of graphite, ceramic, metal, metal-carbide, metal-nitride, and metal-boride.

Embodiment 8: The effusion cell of any one of Embodiments 1 through 7, wherein the crucible has a lining comprising a material selected from the group consisting of TaC, graphitic carbon, silicon carbide, boron carbide, silicon nitride, or AN.

Embodiment 9: The effusion cell of any one of Embodiments 1 through 8, wherein the effusion cell does not include any tantalum or platinum resistive filaments.

Embodiment 10: The effusion cell of any one of Embodiments 1 through 9, wherein an axis of the delivery tube is oriented at an angle relative to a vertical axis of the crucible.

Embodiment 11: The effusion cell of Embodiment 10, wherein the axis of the delivery tube is oriented at an angle of between 0° and 135° relative to the vertical axis of the crucible.

Embodiment 12: The effusion cell of Embodiment 11, wherein the axis of the delivery tube is oriented at an angle of about 90° relative to the vertical axis of the crucible.

Embodiment 13: The effusion cell of any one of Embodiments 1 through 12, further comprising a shutter assembly operatively associated with the delivery tube, the shutter assembly configured to selectively interrupt flow of evaporated or sublimated material out from the delivery tube.

Embodiment 14: The effusion cell of Embodiment 13, wherein the shutter assembly is configured to selectively open and close one or more passageways for the flow of evaporated or sublimated material through the delivery tube.

Embodiment 15: The effusion cell of Embodiment 13 or Embodiment 14, wherein the shutter assembly is configured to selectively open and close the one or more passageways within the delivery tube without changing a direction of movement of the shutter assembly.

Embodiment 16: The effusion cell of any one of Embodiments 13 through 15, wherein the shutter assembly comprises a rotational shutter assembly.

Embodiment 17: The effusion cell of Embodiment 16, wherein the rotational shutter assembly includes a rotational valve and a fixed nozzle.

Embodiment 18: The effusion cell of Embodiment 17, wherein the rotational valve includes a first plurality of openings, the nozzle includes a second plurality of openings, and wherein continuous rotation of the rotational valve in a single rotational direction about a rotational axis of the rotational valve relative to the fixed nozzle causes sequential and repeatable alignment and misalignment of the first and second pluralities of openings so as to cause sequential and repeatable opening and closing of the one or more passageways within the delivery tube.

Embodiment 19: The effusion cell of Embodiment 18, further comprising a drive mechanism capable of driving rotation of the rotational valve at a rotational speed sufficient to cause opening or closing of the one or more passageways within the delivery tube in 0.1 second or less.

Embodiment 20: The effusion cell of any one of Embodiments 13 through 19, wherein the shutter assembly is disposed at least partially within the delivery tube.

Embodiment 21: The effusion cell of any one of Embodiments 1 through 20, wherein the at least one radio-frequency (RF) heating element comprises an RF coil surrounding the crucible.

Embodiment 22: The effusion cell of any one of Embodiments 1 through 21, further comprising at least one additional radio-frequency (RF) heating element located and configured to heat material contained in the delivery tube so as to hinder condensation of evaporated or sublimated material flowing through the delivery tube and out from the effusion cell.

Embodiment 23: The effusion cell of any one of Embodiments 1 through 22, wherein the effusion cell does not include a resistive heating element.

Embodiment 24: The effusion cell of any one of Embodiments 1 through 23, further comprising a supply tube extending from the crucible, the supply tube located and configured to trap condensate originating from the evaporated or sublimated material and to deliver the condensate back to the crucible.

Embodiment 25: The effusion cell of Embodiment 24, wherein the supply tube has an end coupled to the crucible.

Embodiment 26: The effusion cell of Embodiment 24 or Embodiment 25, further comprising one or more baffles disposed within the supply tube.

Embodiment 27: The effusion cell of any one of Embodiments 24 through 26, wherein at least one of the supply tube and an opening of the supply tube is cooled.

Embodiment 28: An effusion cell, comprising: a crucible configured to contain therein a material to be evaporated or sublimated within the effusion cell; a delivery tube configured to deliver evaporated or sublimated material originating from the crucible out from the effusion cell and into a chamber; a supply tube extending from the crucible, the supply tube located and configured to trap condensate originating from the evaporated or sublimated material and to deliver the condensate back to the crucible; and at least one heating element located and configured to heat material contained in the crucible so as to cause evaporation or sublimation of the material in the crucible and flow of the evaporated or sublimated material through the delivery tube and out from the effusion cell; wherein the effusion cell is configured such that the crucible can be filled with the material to be evaporated or sublimated without removing the effusion cell from a process vacuum chamber.

Embodiment 29: The effusion cell of Embodiment 28, wherein the effusion cell is configured such that the crucible can be filled with the material to be evaporated or sublimated without interrupting a processing operation carried out releasing a vacuum within the chamber into which the evaporated or sublimated material originating from the crucible is delivered out from the effusion cell through the delivery tube.

Embodiment 30: The effusion cell of Embodiment 28 or Embodiment 29, wherein the at least one heating element comprises a radio-frequency (RF) heating element.

Embodiment 31: The effusion cell of any one of Embodiments 28 through 30, wherein the crucible comprises one or more walls, each wall of the one or more walls having an average wall thickness greater than or equal to 0.036 inch.

Embodiment 32: The effusion cell of Embodiment 31, wherein each wall of the one or more walls has an average wall thickness greater than or equal to 0.25 inch.

Embodiment 33: The effusion cell of Embodiment 32, wherein each wall of the one or more walls has an average wall thickness greater than or equal to 0.50 inch.

Embodiment 34: The effusion cell of any one of Embodiments 28 through 33, wherein the effusion cell is configured such that the crucible can be filled with the material to be evaporated or sublimated without interrupting a processing operation carried out releasing a vacuum within the chamber into which the evaporated or sublimated material originating from the crucible is delivered out from the effusion cell through the delivery tube.

Embodiment 35: The effusion cell of any one of Embodiments 28 through 34, wherein the crucible comprises a material selected from the group consisting of graphite, ceramic, metal, metal-carbide, metal-nitride, and metal-boride.

Embodiment 36: The effusion cell of any one of Embodiments 28 through 35, wherein the crucible has a lining comprising a material selected from the group consisting of TaC, graphitic carbon, silicon carbide, boron carbide, silicon nitride, and AN.

Embodiment 37: The effusion cell of any one of Embodiments 28 through 36, wherein the effusion cell does not include any tantalum or platinum resistive filaments.

Embodiment 38: The effusion cell of any one of Embodiments 28 through 37, wherein an axis of the delivery tube is oriented at an angle relative to a vertical axis of the crucible.

Embodiment 39: The effusion cell of Embodiment 38, wherein the axis of the delivery tube is oriented at an angle of between 0° and 135° relative to the vertical axis of the crucible.

Embodiment 40: The effusion cell of Embodiment 39, wherein the axis of the delivery tube is oriented at an angle of about 90° relative to the vertical axis of the crucible.

Embodiment 41: The effusion cell of any one of Embodiments 28 through 40, further comprising a shutter assembly operatively associated with the delivery tube, the shutter assembly configured to selectively interrupt flow of evaporated or sublimated material out from the delivery tube.

Embodiment 42: The effusion cell of Embodiment 41, wherein the shutter assembly is configured to selectively open and close one or more passageways for the flow of evaporated or sublimated material through the delivery tube.

Embodiment 43: The effusion cell of Embodiment 41 or Embodiment 42, wherein the shutter assembly is configured to selectively open and close the one or more passageways within the delivery tube without changing a direction of movement of the shutter assembly.

Embodiment 44: The effusion cell of any one of Embodiments 41 through 43, wherein the shutter assembly comprises a rotational shutter assembly.

Embodiment 45: The effusion cell of Embodiment 44, wherein the rotational shutter assembly includes a rotational valve and a fixed nozzle.

Embodiment 46: The effusion cell of Embodiment 45, wherein the rotational valve includes a first plurality of openings, the nozzle includes a second plurality of openings, and wherein continuous rotation of the rotational valve in a single rotational direction about a rotational axis of the rotational valve relative to the fixed nozzle causes sequential and repeatable alignment and misalignment of the first and second pluralities of openings so as to cause sequential and repeatable opening and closing of the one or more passageways within the delivery tube.

Embodiment 47: The effusion cell of Embodiment 46, further comprising a drive mechanism capable of driving rotation of the rotational valve at a rotational speed sufficient to cause opening or closing of the one or more passageways within the delivery tube in 0.1 second or less.

Embodiment 48: The effusion cell of any one of Embodiments 41 through 47, wherein the shutter assembly is disposed at least partially within the delivery tube.

Embodiment 49: The effusion cell of any one of Embodiments 28 through 48, wherein the at least one heating element comprises an RF coil surrounding the crucible.

Embodiment 50: The effusion cell of any one of Embodiments 28 through 49, further comprising at least one additional heating element located and configured to heat material contained in the delivery tube so as to hinder condensation of evaporated or sublimated material flowing through the delivery tube and out from the effusion cell.

Embodiment 51: The effusion cell of any one of Embodiments 28 through 50, wherein the effusion cell does not include a resistive heating element.

Embodiment 52: The effusion cell of any one of Embodiments 28 through 51, wherein the supply tube has an end coupled to the crucible.

Embodiment 53: The effusion cell of any one of Embodiments 28 through 52, further comprising one or more baffles disposed within the supply tube.

Embodiment 54: The effusion cell of any one of Embodiments 28 through 53, wherein at least one of the supply tube and an opening of the supply tube is cooled.

Embodiment 55: A semiconductor substrate processing system, comprising: a chamber; at least one vacuum pump configured to evacuate gas from the chamber so as to establish a vacuum therein; and at least one effusion cell as recited in any one of Embodiments 1 through 54 operatively associated with the chamber and configured to selectively introduce evaporated or sublimated material into the chamber from the at least one effusion cell.

Embodiment 56: The semiconductor substrate processing system of Embodiment 55, wherein the semiconductor substrate processing system comprises a physical vapor deposition system.

Embodiment 57: The semiconductor substrate processing system of Embodiment 56, wherein the physical vapor deposition system comprises a molecular beam epitaxy (MBE) system.

Embodiment 58: A method comprising fabrication of an effusion cell as recited in any one of Embodiments 1 through 54.

Embodiment 59: A method of processing a semiconductor substrate, comprising introducing evaporated or sublimated material into a vacuum chamber using at least one effusion cell as recited in any one of Embodiments 1 through 54.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventor.

What is claimed is:

1. An effusion cell, comprising:
    a crucible configured to contain therein a material to be evaporated or sublimated within the effusion cell;
    a delivery tube configured to deliver evaporated or sublimated material originating from the crucible out from the effusion cell and into a deposition chamber;
    a supply tube extending from and physically coupled to the crucible at a first end thereof, the supply tube located and configured to trap condensate originating from the evaporated or sublimated material and to deliver the condensate back to the crucible;
    at least one heating element located and configured to heat material contained in the crucible so as to cause evaporation or sublimation of the material in the crucible and flow of the evaporated or sublimated material through the delivery tube and out from the effusion cell;
    a load lock device including an access port and a vacuum pump; and
    a thermal isolator between the load lock device and the supply tube;
    wherein the effusion cell is configured such that the supply tube and the crucible can be filled with the material to be evaporated or sublimated without removing the effusion cell from the deposition chamber and while maintaining the effusion cell under vacuum;
    wherein the effusion cell is enclosed within a vacuum housing; and wherein a second end of the supply tube opposite the first end is open to the vacuum housing thereabout through the thermal isolator.

2. The effusion cell of claim 1, wherein the effusion cell is configured such that the crucible can be filled with the material to be evaporated or sublimated without interrupting a processing operation carried out using the effusion cell and without releasing a vacuum within the deposition chamber into which the evaporated or sublimated material originating from the crucible is delivered out from the effusion cell through the delivery tube.

3. The effusion cell of claim 1, wherein the at least one heating element comprises a radio-frequency (RF) heating element.

4. The effusion cell of claim 1, wherein the crucible comprises one or more walls, each wall of the one or more walls having an average wall thickness greater than or equal to 0.036 inch.

5. The effusion cell of claim 4, wherein each wall of the one or more walls has an average wall thickness greater than or equal to 0.25 inch.

6. The effusion cell of claim 5, wherein each wall of the one or more walls has an average wall thickness greater than or equal to 0.50 inch.

7. The effusion cell of claim 1, wherein the crucible has a lining comprising a material selected from the group consisting of TaC, graphitic carbon, silicon carbide, boron carbide, silicon nitride, and AlN.

8. The effusion cell of claim 1, wherein an axis of the delivery tube is oriented at an angle relative to a vertical axis of the crucible.

9. The effusion cell of claim 8, wherein the axis of the delivery tube is oriented at an angle of about 90° relative to an axis of the crucible.

10. The effusion cell of claim 1, further comprising a shutter assembly operatively associated with the delivery tube, the shutter assembly configured to selectively interrupt flow of evaporated or sublimated material out from the delivery tube.

11. The effusion cell of claim 10, wherein the shutter assembly is configured to selectively open and close one or more passageways within the delivery tube without changing a direction of movement of the shutter assembly.

12. The effusion cell of claim 11, wherein the shutter assembly comprises a rotational shutter assembly.

13. The effusion cell of claim 12, wherein the rotational shutter assembly includes a rotational valve and a fixed nozzle.

14. The effusion cell of claim 13, wherein the rotational valve includes a first plurality of openings, the nozzle includes a second plurality of openings, and wherein continuous rotation of the rotational valve in a single rotational direction about a rotational axis of the rotational valve relative to the fixed nozzle causes sequential and repeatable alignment and misalignment of the first and second pluralities of the openings so as to cause sequential and repeatable opening and closing of the one or more passageways within the delivery tube.

15. The effusion cell of claim 14, further comprising a drive mechanism capable of driving rotation of the rotational valve at a rotational speed sufficient to cause opening or closing of the one or more passageways within the delivery tube in 0.1 second or less.

16. The effusion cell of claim 10, wherein the shutter assembly is disposed at least partially within the delivery tube.

17. The effusion cell of claim 1, further comprising at least one additional heating element located and configured to heat material contained in the delivery tube so as to hinder condensation of evaporated or sublimated material flowing through the delivery tube and out from the effusion cell.

18. The effusion cell of claim 1, further comprising one or more baffles disposed within the supply tube.

19. The effusion cell of claim 1, wherein at least one of the supply tube and an opening of the supply tube is cooled.

20. A semiconductor substrate processing system, comprising:
- a deposition chamber;
- at least one vacuum pump configured to evacuate gas from the deposition chamber so as to establish a vacuum therein; and
- at least one effusion cell as recited in claim 1 operatively associated with the deposition chamber and configured to selectively introduce evaporated or sublimated material into the deposition chamber from the at least one effusion cell.

* * * * *

UNITED STATES PATENT AND TRADEMARK OFFICE
CERTIFICATE OF CORRECTION

PATENT NO. : 10,329,688 B2
APPLICATION NO. : 15/495458
DATED : June 25, 2019
INVENTOR(S) : William Alan Doolittle Page 1 of 1

It is certified that error appears in the above-identified patent and that said Letters Patent is hereby corrected as shown below:

In the Specification
Column 18, Line 61, change "nitride, or AN." to --nitride, or AlN.--
Column 20, Line 64, change "nitride, and AN." to --nitride, and AlN.--

Signed and Sealed this
Third Day of September, 2019

Andrei Iancu
*Director of the United States Patent and Trademark Office*